United States Patent [19]

Miyashita et al.

[11] Patent Number: 5,303,197
[45] Date of Patent: Apr. 12, 1994

[54] NON-VOLATILE SEMICONDUCTOR MEMORY DEVICE HAVING EEPROM CELL, DUMMY CELL, AND SENSE CIRCUIT FOR INCREASING RELIABILITY AND ENABLING ONE-BIT OPERATION

[75] Inventors: Takumi Miyashita, Inagi; Toshiyuki Teramoto, Kawasaki; Haruo Koizumi, Iruma, all of Japan

[73] Assignee: Fujitsu Limited, Japan

[21] Appl. No.: 690,482

[22] Filed: Apr. 24, 1991

[30] Foreign Application Priority Data

Apr. 25, 1990 [JP] Japan .................. 2-107516

[51] Int. Cl.$^5$ .................................................. G11C 7/00
[52] U.S. Cl. ................................... 365/210; 365/189.07
[58] Field of Search ............... 365/189.07, 190, 207, 365/208, 210

[56] References Cited

U.S. PATENT DOCUMENTS

| | | | |
|---|---|---|---|
| 4,642,673 | 2/1987 | Miyamoto et al. | 365/185 X |
| 4,807,003 | 2/1989 | Mohammadi et al. | 365/182 X |
| 4,935,790 | 6/1990 | Cappelletti et al. | 365/185 X |
| 5,081,610 | 1/1992 | Olivo et al. | 365/210 X |

FOREIGN PATENT DOCUMENTS

| | | |
|---|---|---|
| 56-108271 | 8/1981 | Japan . |
| 59-155968 | 9/1984 | Japan . |
| 63-156361 | 6/1988 | Japan . |
| 63-166274 | 7/1988 | Japan . |

OTHER PUBLICATIONS

J. Miyamoto et al. "An Experimental 5-V-Only 256-k-bit CMOS EEPROM with a High-Performance Single-Polysilicon Cell", IEEE J. Solid-State Circuit, vol. 21, No. 5, pp. 852-860, Oct. 1986.

H. Ishihara et al. "A Single-Polysilicon Flip-Flop EEPROM for ASIC Application", IEEE pp. 3-31.1-3.4, 1989.

Cuppens et al., "An EEPROM for Microprocessors and Custom Logic", IEEE Journal of Solid-State Circuits, vol. SC-20, No. 2, Apr. 1985, pp. 603-608.

Gastaldi et al., "A 1-Bit CMOS EEPROM with Enhanced Verification", IEEE Journal of Solid-State Circuits, vol. 23, No. 5, Oct. 1988, pp. 1150-1156.

Primary Examiner—Steven Mottola
Attorney, Agent, or Firm—Welsh & Katz, Ltd.

[57] ABSTRACT

A non-volatile semiconductor memory device comprises an EEPROM cell, a dummy cell, and a sense circuit. The EEPROM cell, the dummy cell and the sense circuit are operatively connected to a drain column line and a control column line, and the sense circuit reads out the content written in the EEPROM cell by the difference between a current flowing through the EEPROM cell from the drain column line and a current flowing through the dummy cell from the control column line. Consequently, write/erase operations of data for each one bit can be carried out in one operation, and access time can be shortened and deterioration of a cell transistor can be decreased in a read-out operation.

20 Claims, 17 Drawing Sheets

⊣⊏ ··· RELATIVELY HIGH VOLTAGE PROOF ENHANCEMENT MODE MOS TRANSISTOR (N-CHANNEL TYPE. THRESHOLD VOLTAGE Vth ≈ 0.3~1.5V)

⊣⊏ ··· RELATIVELY HIGH VOLTAGE PROOF INTERMEDIATE THRESHOLD MOS TRANSISTOR (N-CHANNEL TYPE. THRESHOLD VOLTAGE Vth ≈ -1~+0.5V)

⊣⊏ ··· NORMAL N-CHANNEL TYPE MOS TRANSISTOR

⊣⊏ ··· NORMAL P-CHANNEL TYPE MOS TRANSISTOR

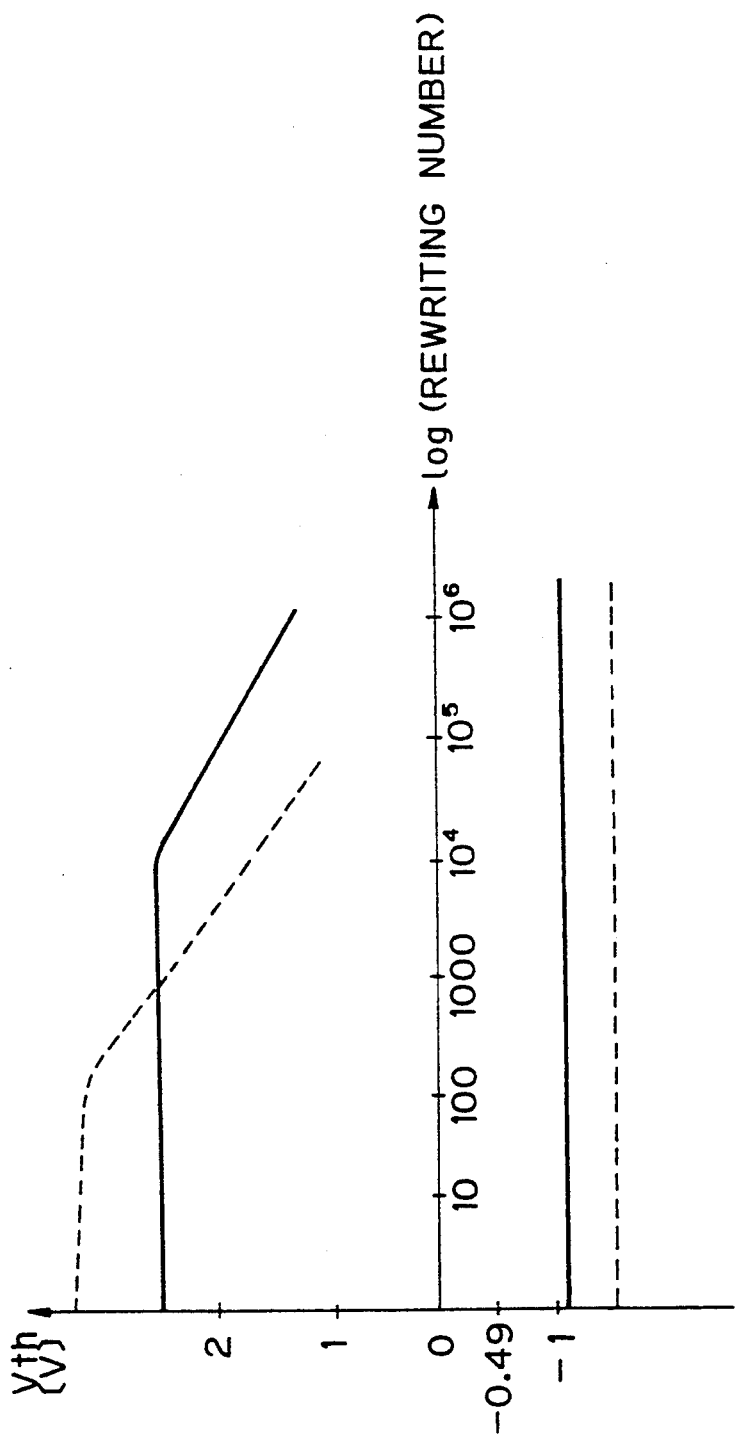

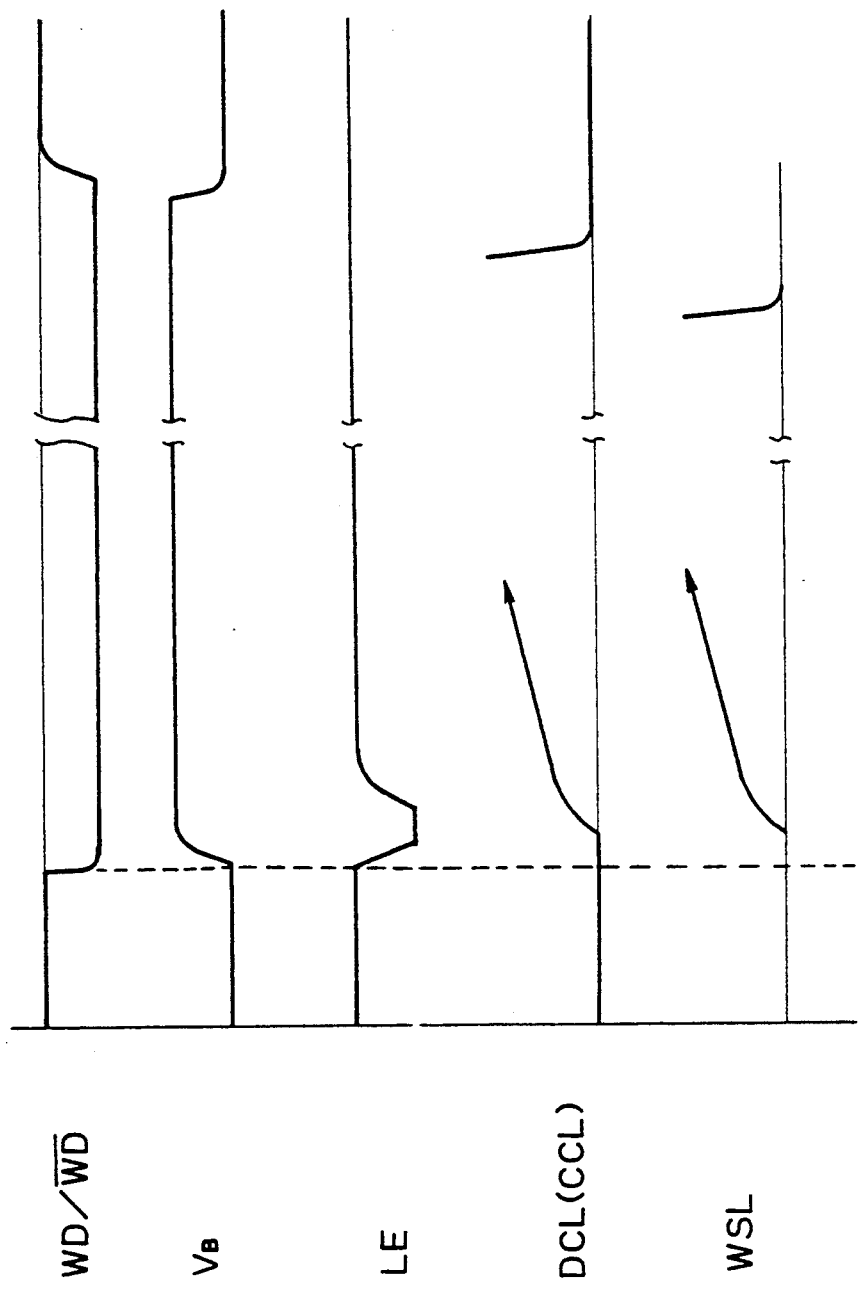

NON-VOLATILE SEMICONDUCTOR MEMORY DEVICE HAVING EEPROM CELL, DUMMY CELL, AND SENSE CIRCUIT FOR INCREASING RELIABILITY AND ENABLING ONE-BIT OPERATION

BACKGROUND OF THE INVENTION

1. Field of the Invention

The present invention relates to a non-volatile semiconductor memory device, more particularly, to a non-volatile semiconductor memory device using an electrically erasable programmable read only memory (EEPROM) cell, a dummy cell, and a sense circuit.

2. Description of the Related Art

Recently, EEPROMs, which can be reprogrammed by electrically erasing the contents previously programmed therein, have come to be preferred over EPROMs which are erased by being irradiated with ultraviolet light. For example, an EEPROM can be used for on-vehicle equipment (e.g., for setting control parameters or codes suitable for an application environment), a measuring apparatus, a camera, a telephone set (e.g., for storing telephone numbers), a telemetering system, a fuzzy control apparatus, and the like. Generally, in the EEPROM, a plurality of bits of a specific group (for example, each column unit, or each word unit) are erased together, and thus a non-volatile semiconductor memory device (EEPROM), which enables a read/erase operation of only one required bit in one operation (operation cycle), is required.

For example, a non-volatile semiconductor memory device according to the prior art comprises an EEPROM cell, transfer gates for selecting the EEPROM cell in response to a select signal applied to a word select line WSL, a write/erase circuit, and a current sense type sense circuit. The EEPROM cell includes a control electrode, a floating gate, a drain, and a source.

Further, in the prior art, a non-volatile semiconductor memory device using a differential sense circuit has been proposed in "An Experimental 5-V-Only 256-kbit CMOS EEPROM with a High-Performance Single-Polysilicon Cell" (IEEE JOURNAL OF SOLID-STATE CIRCUITS, VOL. SC-21. No 5. OCTOBER 1986).

Note, in these non-volatile semiconductor memory devices (EEPROMs), a plurality of bits of a specific group (for example, each column unit, or each word unit) are erased, and an erase cycle and a write cycle are carried out individually, so that the required time for a rewriting operation becomes long. Further, since the cell to be written into is previously erased and is then rewritten the cell itself is deteriorated. Furthermore, in a non-volatile semiconductor memory device using a differential sense circuit according to the prior art, the required time for a rewriting operation becomes long and cells are deteriorated in a short time, because an erase operation and a write operation are individually carried out.

In addition, in the prior art, a plurality of single polysilicon EEPROM cells are developed and provided. For example, such single polysilicon EEPROM cells are disclosed in Japanese Unexamined Patent Publication (Kokai) No. 59-155968 (corresponding to U.S. Pat. No. 4,642,673), Japanese Unexamined Patent Publication (Kokai) No. 63-156361 (corresponding to U.S. Pat. No. 4,807,003), Japanese Unexamined Patent Publication (Kokai) No. 63-166274, and the like. These single polysilicon EEPROM cells can be used in a non-volatile semiconductor memory device according to the present invention.

SUMMARY OF THE INVENTION

It is an object of the present invention to provide a non-volatile semiconductor memory device having high performance operation characteristics without being influenced by the fluctuations of threshold voltages of a cell transistor and a dummy cell. Further, it is another object of the present invention to provide a non-volatile semiconductor memory device enabling a write/erase operation of each individual bit in one operation.

According to the present invention, there is provided a non-volatile semiconductor memory device comprising: first and second signal lines; a memory cell, operatively connected to the first and second signal lines, for storing data; a dummy cell, operatively connected to the first and second signal lines; and a sense circuit, for amplifying the difference between a potential of the first signal line and a potential of the second signal line; wherein, when a first current flowing through the memory cell from the first signal line, in response to data stored in the memory cell, is larger than a second current flowing through the dummy cell from the second signal line at a read-out operation, the second current is decreased; and when the first current is smaller than the second current at the read-out operation, the second current is increased.

Furthermore, according to the present invention, there is also provided a micro-controller formed in a single semiconductor body comprising: a central processing unit core; an input/output port, connected to the central processing unit core, for inputting and outputting data and signals; a memory portion, connected to the central processing unit core, for writing, erasing, and reading out data in accordance with the control of the central processing unit core. The memory portion may comprise: first and second signal lines; a memory cell, operatively connected to the first and second signal lines, for storing data; a dummy cell, operatively connected to the first and second signal lines; and a sense circuit, for amplifying the difference between a potential of the first signal line and a potential of the second signal line; wherein, when a first current flowing through the memory cell from the first signal line, in response to data stored in the memory cell, is larger than a second current flowing through the dummy cell from the second signal line at a read-out operation, the second current is decreased; and when the first current is smaller than the second current at the read-out operation, the second current is increased.

The non-volatile semiconductor memory device may further comprise: first and second transfer gates, provided between the memory cell and the first and second signal lines; a word select line, applied with a word select signal for controlling the first and second transfer gates; third and fourth transfer gates, provided between the dummy cell and the first and second signal lines; and a dummy word select line, applied with a dummy word select signal for controlling the third and fourth transfer gates. A gate of the dummy cell may be connected to the first signal line through the third transfer gate, a drain thereof may be connected to the second signal line through the fourth transfer gate, and a source thereof may be connected to the ground through a fifth transfer gate controlled by a read control signal.

Further, the non-volatile semiconductor memory device may further comprise a write stabilizing circuit, connected to the first and second signal lines, for improving reliability at a write operation, with an output line of the write stabilizing circuit connected to the memory cell. The output line of the write stabilizing circuit may be connected to the ground through a sixth transfer gate controlled by a read control signal. The non-volatile semiconductor memory device may further comprise a first high-voltage switching circuit connected to the first signal line and a second high-voltage switching circuit connected to the second signal line, for boosting and applying a write/erase power supply voltage between the first and second signal lines by using a pumping clock signal.

The memory cell may comprise: a cell transistor, including a floating gate, a drain connected to the first signal line through the first transfer gate, and a source connected to an output line of a write stabilizing circuit, for storing data by injecting electrons into the floating gate; and a control gate, including a control electrode connected to the second signal line through the second transfer gate, and a floating electrode connected to the floating gate of the cell transistor.

The cell transistor and the dummy cell may be formed the same size. A gate length and a gate width of the dummy cell may be formed the same as a gate length and a gate width of the cell transistor. A gate length of the dummy cell may be determined in accordance with the characteristics of the cell transistor. The cell transistor and the dummy cell may be formed in the same processes of producing the non-volatile semiconductor memory device. The memory cell may include a single polycrystal line silicon layer of a large occupied area, and the first and second signal lines may be wired above the area occupied by the memory cell. The memory cell may be an EEPROM cell.

The sense circuit may be a differential type sense amplifier. The sense circuit may be connected to the first and second signal lines through a seventh and eighth transfer gates with a bias voltage applied thereto. The sense circuit may be used to write specific data into the memory cell.

The first and second signal lines and an output line of a write stabilizing circuit may be plurally provided, the memory cell may be plurally provided in parallel to each group of the first and second signal lines and the output lines of the write stabilizing circuit through a select circuit, and one of the plurality of memory cells may be selected in response to select signals applied to the select circuit.

The non-volatile semiconductor memory device may further comprise: a high voltage generation portion for applying a high voltage to the memory cell; an address latch circuit for latching input and output addresses; and a data latch circuit for latching input and output data. The non-volatile semiconductor memory device may be formed in a single semiconductor body and the non-volatile semiconductor memory device may further comprise: a high voltage generation circuit, connected to the sense circuit, for applying a high voltage to the memory cell; an address buffer, connected to a column decoder, a row decoder, and a dummy word decoder, for inputting and outputting addresses; a data input/output portion connected to the sense circuit, for inputting and outputting data; and a control signal buffer for receiving control signals; and a control logic circuit, connected to the control signal buffer, for controlling the state of the non-volatile semiconductor memory device.

The non-volatile semiconductor memory device may further comprise: a threshold voltage measuring column including a test dummy cell and a test sense circuit, for estimating a threshold voltage of the memory cell by measuring the test dummy cell, a threshold voltage measuring terminal, connected to the threshold voltage measuring column, for applying various voltages, and a threshold voltage measuring input/output portion, connected to the test sense circuit, for inputting or detecting data to measure the threshold voltage of the memory cell when applying various voltages to the threshold voltage measuring terminal.

BRIEF DESCRIPTION OF THE DRAWINGS

The present invention will be more clearly understood from the description of the preferred embodiments as set forth below with reference to the accompanying drawings, wherein:

FIG. 5 is a diagram indicating an example of programming-inhibiting characteristics of the EEPROM cell;

FIG. 9 is a waveform diagram for explaining a write/erase operation in the non-volatile semiconductor memory device shown in FIG. 4;

DESCRIPTION OF THE PREFERRED EMBODIMENTS

For a better understanding of the preferred embodiments, the problems of the prior art will be explained, with reference to FIG. 1.

Figure 1:
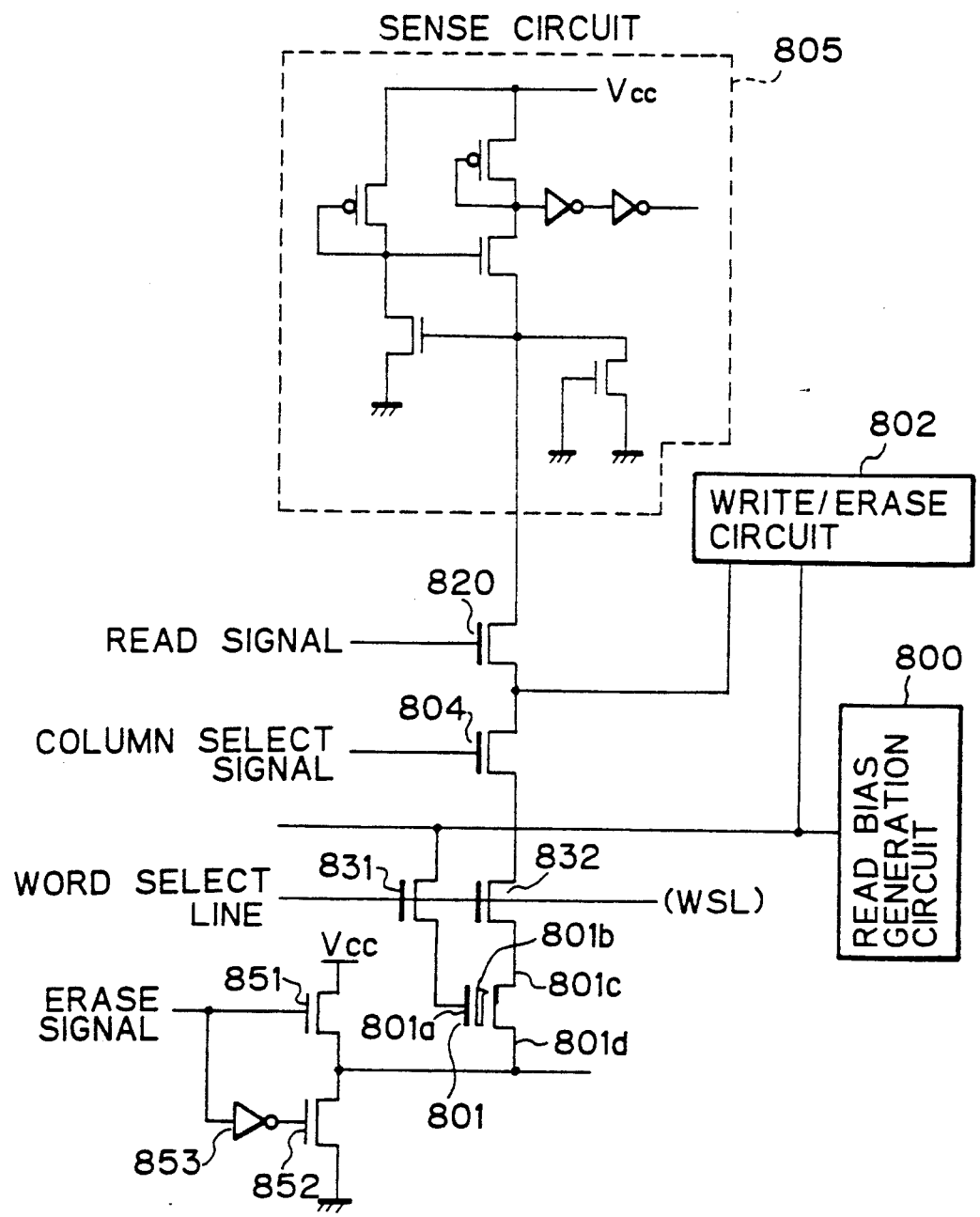
FIG. 1 is a circuit diagram indicating an example of a non-volatile semiconductor memory device according to the prior art.

FIG. 1 is a circuit diagram indicating an example of a non-volatile semiconductor memory device (EEPROM) according to the prior art. The EEPROM can be reprogrammed by electrically erasing the contents previously programmed in the EEPROM.

As shown in FIG. 1, a non-volatile semiconductor memory device comprises an EEPROM cell 801, transfer gates 831, 832 for selecting the EEPROM cell 801 in response to a select signal applied to a word select line WSL, a read bias generation circuit 800 for generating a bias voltage used in a read out operation, a write/erase circuit 802, and a current sense type sense circuit 805. Further, the non-volatile semiconductor memory device comprises: gate transistors 820 and 804, which are controlled by a read signal R and a column select signal and are provided between the cell 801 and the sense circuit 805; and transistors 851, 852 and an inverter 853 for erasing the contents written in a specific numbers of EEPROM cells 801 in response to an erase signal. Note, in the EEPROM cell 801, a reference 801a denotes a control electrode, 801b denotes a floating gate, 801c denotes a drain, and 801d denotes a source. As described above, the non-volatile semiconductor memory device shown in FIG. 1 uses the current sense type sense circuit 805 without using a dummy cell, and write/erase/read-out operations are carried out thereby. Note, in this non-volatile semiconductor memory device, a plurality of bits of a specific group (for example, each column unit, or each word unit) are erased.

As described above, in the non-volatile semiconductor memory device shown in FIG. 1, a latch operation must be carried out when writing data to the EEPROM cell 801, however, write/erase/read-out operations are carried out by using a current sense type sense circuit 805. Further, in the non-volatile semiconductor memory device shown in FIG. 1, a bias generation circuit 800, which is used to generate a bias voltage for applying to a gate (control electrode 801a) of an EEPROM cell 801 at the read-out operation, must be provided. Therefore, a time for setting the bias voltage output from the bias generation circuit 800 becomes an obstruction to high speed access. Furthermore, in the non-volatile semiconductor memory device, an erase cycle (about 10 msec.) and a write cycle (about 10 msec.) are individually carried out, and thus the required time for a rewriting operation becomes long, i.e., determined at about 20 msec. In addition, the cell to be written is previously erased and it is rewritten thereafter, and thus the cell deteriorates at double the speed in the worst case. Namely, in the non-volatile semiconductor memory device according to the prior art, the required time for a rewriting operation becomes long and cells are deteriorated in a short time, because an erase operation and a write operation are individually carried out.

Note, in the existing technique of producing a semiconductor device, a threshold voltage Vth of an EEPROM cell may fluctuate with processes variations int producing the EEPROM cell on a semiconductor substrate.

When the threshold voltage Vth of the EEPROM cell fluctuates, a read out operation cannot be exactly carried out.

Next, a principle of a non-volatile semiconductor memory device according to the present invention will be explained, with reference to FIG. 2.

Figure 2:
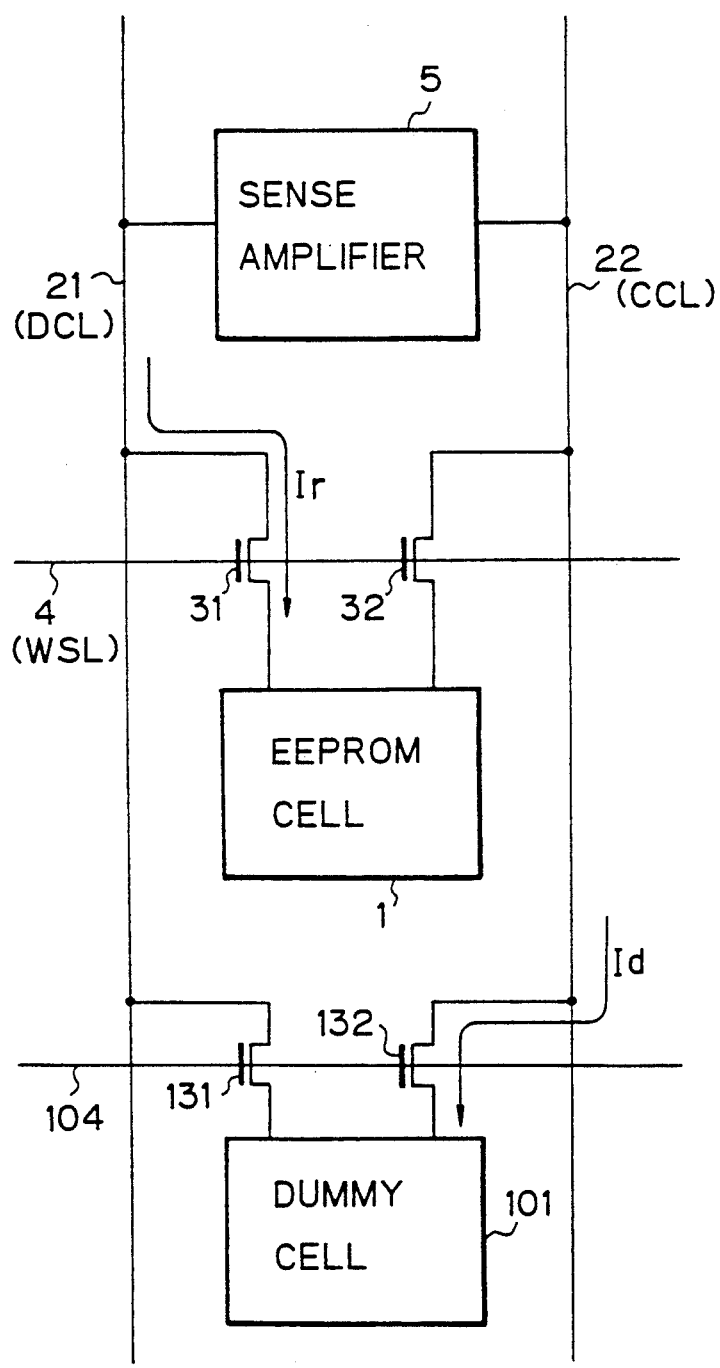
FIG. 2 is a diagram indicating a principle of a non-volatile semiconductor memory device according to the present invention.

FIG. 2 is a diagram indicating a principle of a non-volatile semiconductor memory device according to the present invention. As shown in FIG. 2, the non-volatile semiconductor memory device of the present invention comprises first and second control lines 21, 22 (or a drain column line DCL, and a control column line CCL), an EEPROM cell 1, a dummy cell 101, and a sense circuit 5.

The first and second control lines 21, 22 are applied with an actuating signal and an inverted signal thereof to control write, erase and read-out operations.

The EEPROM cell 1 is connected to the first and second control lines 21, 22 through first and second transfer gates 31, 32, and these first and second transfer gates 31, 32 are controlled by a word select signal applied to a word select line 4. The dummy cell 101 is connected to the first and second control lines 21, 22 through third and fourth transfer gates 131, 132, and these third and fourth transfer gates 131, 132 are controlled by a dummy word select signal applied to a dummy word select line 104. The sense circuit 5 is connected to the first and second control lines 21, 22 to read out the content written in the EEPROM cell 1 by the difference between a current (Ir) flowing through the EEPROM cell 1 from the first control line 21 and a current (Id) flowing through the dummy cell 101 from the second control line 22. Note, the sense circuit is also used to write data into the EEPROM cell 1.

According to the non-volatile semiconductor memory device having the above configuration, write/erase/read-out operations of data for each one bit can be carried out in one operation (operation cycle). Therefore, in the non-volatile semiconductor memory device of the present invention, each required one bit can be written or erased in one operation, individually, the same as in a general DRAM, so that deterioration of a cell transistor can be decreased. Furthermore, in the non-volatile semiconductor memory device according to the present invention, an EEPROM cell transistor (11) and a dummy cell transistor (or dummy cell 101) are formed in the same processes of producing the non-volatile semiconductor memory device, so that changes to the threshold voltages of the EEPROM cell transistor and the dummy cell transistor track each other when these threshold voltages fluctuate with wafer processes deviations inherent in the fabrication of the non-volatile semiconductor memory device.

Below, the preferred embodiments of non-volatile semiconductor memory device according to the present invention will be explained, with reference to the accompanying drawings.

Figure 3:
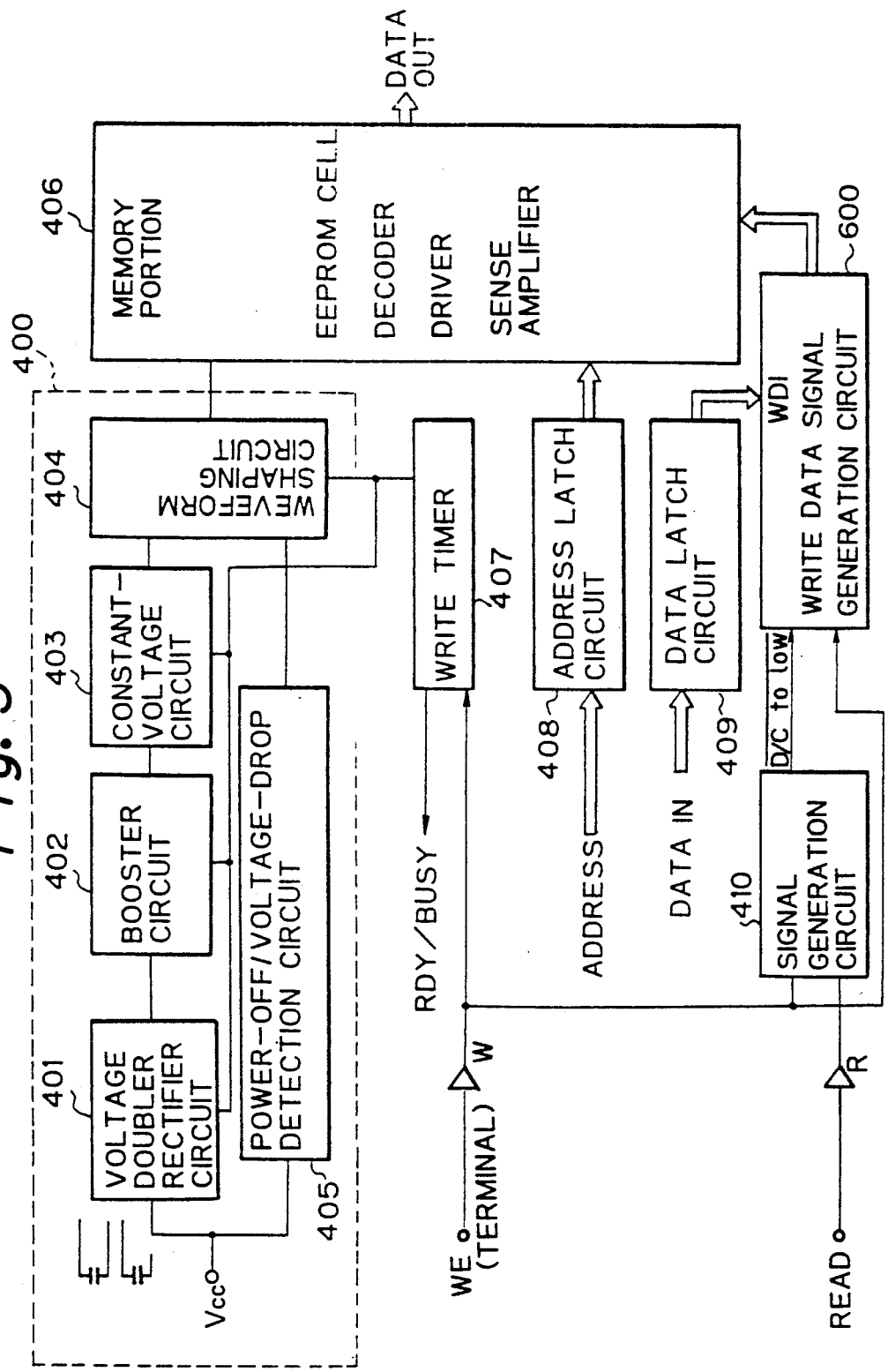
FIG. 3 is a diagram indicating a overall configuration of an example of a non-volatile semiconductor memory device applying the present invention.

FIG. 3 is a diagram indicating a overall configuration of an example of a non-volatile semiconductor memory device applying the present invention. Specifically, FIG. 3 indicates a system configuration for writing data to an EEPROM cell. As shown in FIG. 3, the system of the non-volatile semiconductor memory device comprises: a memory portion 406 including an EEPROM cell, a decoder, a driver and a sense amplifier; a high voltage generation portion 400 for applying a high voltage (for example, about 12~23 volts higher than the normal power supply voltage) to the memory portion 406; a write timer 407; an address latch circuit 408; a data latch circuit 409; a control signal generation circuit 410; and a write data signal generation circuit 600.

The high voltage generation portion 400 comprises: a voltage doubler rectifier circuit 401 for doubling an input power supply voltage Vcc; a booster circuit 402 for boosting an output of the voltage doubler rectifier circuit 401; a constant-voltage circuit 403 for stabilizing an output of the booster circuit 402; a waveform shaping circuit 404 for waveform-shaping of an output of the constant-voltage circuit 403 in order to prevent a deterioration of a tunnel oxide film of an EEPROM cell; and a power-off/voltage-drop detection circuit 405. Note, the waveform shaping circuit 404 is used to waveform-shape the output of the constant-voltage circuit 403, and the write timer 407 is used to stop the high voltage after a predetermined time by applying the output signal of the write timer 407 to the high voltage generation portion 400. Further, the high voltage is applied to the memory portion 406, and data applied to the data latch circuit 409 are written to the addresses of the memory portion 406 corresponding to address signals applied to the address latch circuit 408. In addition, the power-off/voltage-drop detection circuit 405 is used to detect a power failure (for example, a cut off of a power supply and a drop of a voltage) during a write operation, and is used to output the result whether the write operation is exactly carried out or not.

Note, the non-volatile semiconductor memory device of the present invention particularly relates to the configuration of the memory portion 406.

Figure 4:
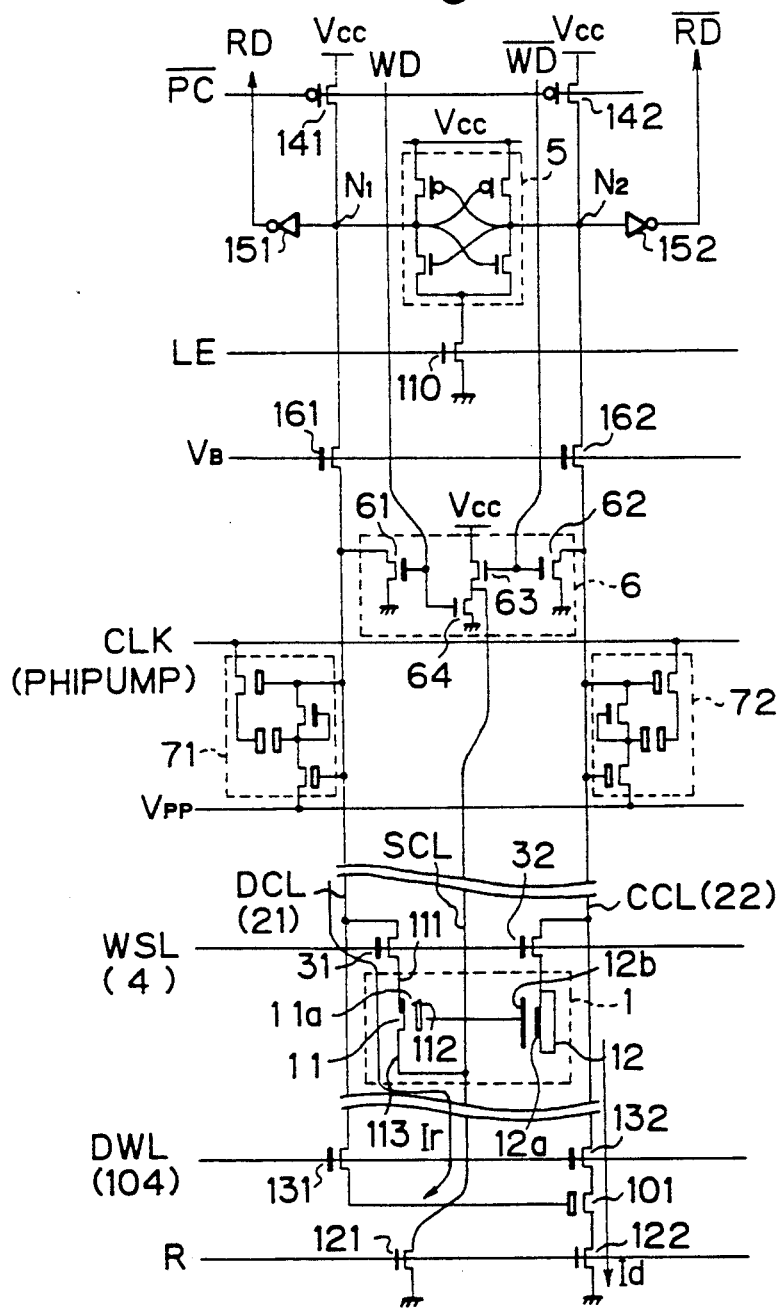
FIG. 4 is a circuit diagram indicating an embodiment of a non-volatile semiconductor memory device according to the present invention.

FIG. 4 is a circuit diagram indicating an embodiment of a non-volatile semiconductor memory device according to the present invention. As shown in FIG. 4, in the non-volatile semiconductor memory device, an EEPROM cell 1 is connected to a drain column line DCL (21) and a control column line CCL (22) through transfer gates 31 and 32. Note, gate terminals of the MOS transistors utilized as transfer gates 31 and 32 (gates of the transfer gates 31 and 32) are applied with a word select signal by a word select line 4.

The drain column line DCL is connected to a gate of a dummy cell transistor 101 through a gate transistor 131, and the control column line CCL is connected to a drain of the dummy cell transistor 101 through a transistor 132. Note, a source of the dummy cell transistor 101 is connected to the ground through a transistor 122 which is controlled by a read-out control signal R. Further, the transistors 131 and 132 are controlled by a dummy word select signal which is applied to a dummy word select line DWL.

Furthermore, pump circuits (high-voltage switching circuits) 71 and 72, which are used to apply a high voltage (for example, about 7~30 volts) between the drain column line DCL and the control column line CCL when write and erase operations are carried out, are provided to the drain column line DCL or the control column line CCL, respectively. Note, these pump circuits 71 and 72 are used to transfer a write/erase power supply voltage Vpp in response to the latched data by a pumping clock signal CLK (PHIPUMP). Further, a write stabilizing circuit 6 is provided between the the drain column line DCL and the control column line CCL. This write stabilizing circuit 6 is constituted by transistors 61–64, and gates of the transistors 61, 64 and 62, 63 are connected to write data lines (WD, $\overline{WD}$) each applying write data WD and $\overline{WD}$. A connection portion between the transistors 63 and 64 is connected to a source column line SCL which is connected to the EEPROM cell 1. Note, this source column line SCL is connected to the ground through a transistor 121 which is controlled by the dummy word select line DWL.

In addition, a sense circuit (differential type sense amplifier) 5 is connected to the drain column line DCL and the control column line CCL at nodes $N_1$ and $N_2$ through transistors 161 and 162 the gates of which have a bias voltage $V_B$ applied thereto. Note, a power supply voltage Vcc is applied to the sense circuit 5, and an ground potential is applied to the sense circuit 5 through a transistor 110 which is controlled by a latch enable signal LE. Namely, read out data RD and $\overline{RD}$, which are output from inverters 151 and 152, are controlled by the latch enable signal LE. Further, the sense circuit 5 reads out the content written in the EEPROM cell 1 by the difference between a current flowing in the control column line CCL through the dummy cell (dummy cell transistor) 101 and a current flowing in the drain column line DCL through the EEPROM cell 1. Note, the levels of the node $N_1$ and the drain column line DCL are inverted levels of the node $N_2$ and the control column line CCL.

The EEPROM cell 1 comprises a cell transistor 11 and a control gate 12. The cell transistor 11 includes a single polycrystal silicon layer (floating gate), a drain 111 of the cell transistor 11 is connected to the drain column line DCL through a transfer gate 31, and a source 113 thereof is directly connected to the source column line SCL. Further, a gate (floating gate) 112 of the cell transistor 11 is connected to an electrode (floating electrode) 12b opposite to a control electrode 12a of the control gate 12. Note, the control electrode 12a is constituted by a diffusion region formed close to a surface of a semiconductor substrate.

In the above descriptions, the cell transistor 11 of the EEPROM cell 1 and the dummy cell (dummy cell transistor) 101 can be formed at the same size. Namely, a gate length (Ld) and a gate width (Wd) of the dummy cell 101 are formed the same as a transistor length (or a gate length Lr) and a transistor width (or a gate width Wr) of the cell transistor 11. In this case, both currents (Ide, Idw) of erased and written states flowing through the dummy cell 101 and the control column line CCL are determined within a current (Ire) of an erased state and a current (Irw) of a written state flowing through the cell transistor 11 and the drain column line DCL (with reference to FIG. 8).

FIG. 5 is a diagram indicating an example of programming-inhibiting characteristics of the EEPROM cell. Generally, write characteristics of an EEPROM cell (1) are decreased in accordance with increasing the number of write/erase operations (rewriting number).

Namely, when the rewriting number becomes large, or the rewriting number is increased to about $10^6$ times (over $10^4$ times), the threshold difference between a written cell and an erased cell (cell transistor 11) becomes small. Note, this phenomenon (programming-inhibiting characteristics) is usually called Window Closing and is shown in FIG. 5. In FIG. 5, broken lines indicate another programming-inhibiting characteristics when a potential difference in a program cycle is larger than the programming-inhibiting characteristics indicated by solid lines.

Figure 6A:
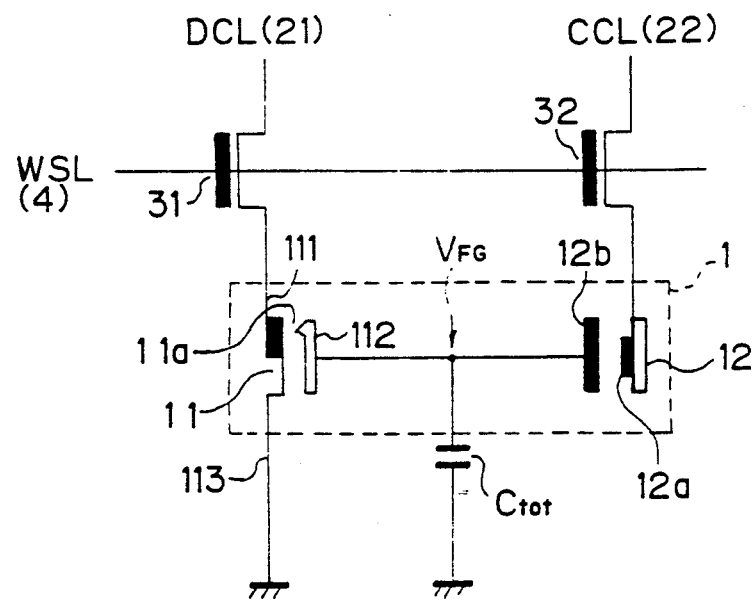
FIGS. 6A and 6B are circuit diagrams indicating the EEPROM cell and the dummy cell of the non-volatile semiconductor memory device shown in FIG. 4.
Figure 6B:
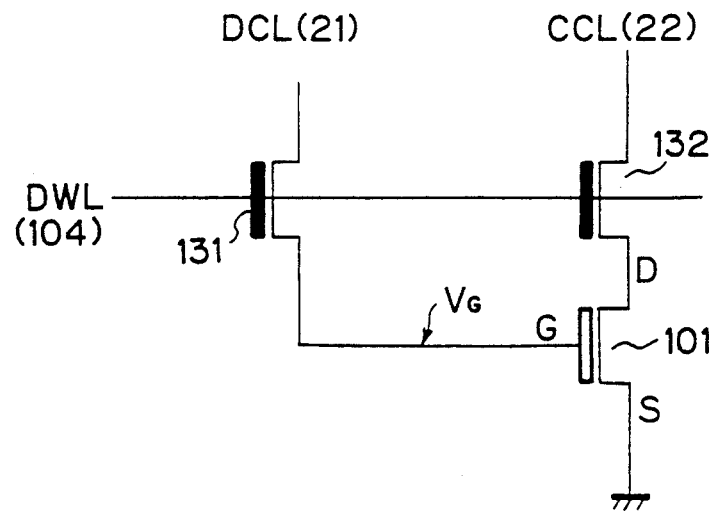
Figure 7A:
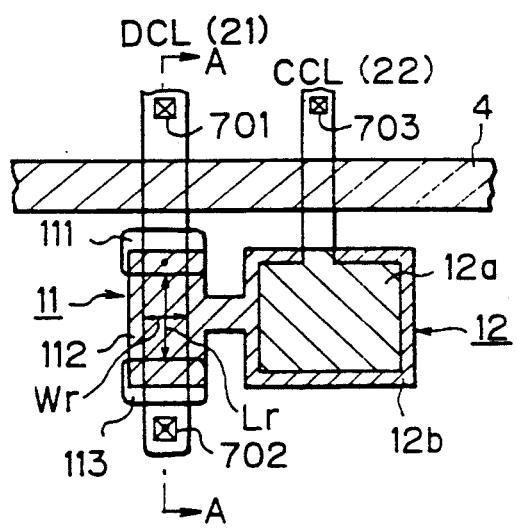
FIGS. 7A to 7D are diagrams indicating configurations of the EEPROM cell and the dummy cell of the non-volatile semiconductor memory device shown in FIG. 4.
Figure 7B:
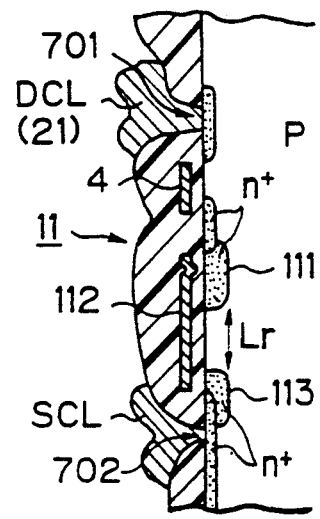
Figure 7C:
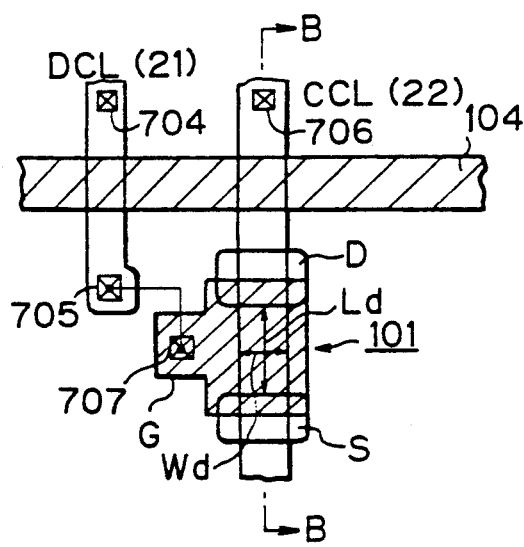
Figure 7D:
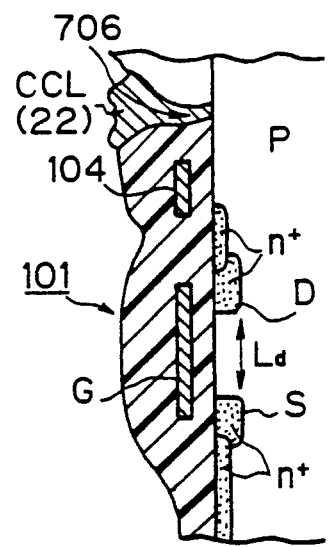

FIGS. 6A and 6B are circuit diagrams indicating the EEPROM cell and the dummy cell of the non-volatile semiconductor memory device shown in FIG. 4, and FIGS. 7A to 7D are diagrams indicating configurations of the EEPROM cell and the dummy cell of the non-volatile semiconductor memory device shown in FIG. 4. Note, FIG. 6A mainly shows an EEPROM cell 1 including a cell transistor 11 and a control gate 12, and FIG. 6B mainly shows a dummy cell 101. Further, FIG. 7A is a plan view indicating the EEPROM cell 1, and FIG. 7B is a sectional view cut along a A—A line shown in FIG. 7A. Similarly, FIG. 7C is a plan view indicating the dummy cell 101, and FIG. 7D is a sectional view cut along a B—B line shown in FIG. 7C. In addition, in FIGS. 7A, 7B, 7C, and 7D, references 701 to 707 denote via holes passing through a layer, or contact holes connecting wirings (DCL, CCL) to a substrate, a diffusion region, or another wiring.

As described above, the cell transistor 11 of the EEPROM cell 1 is preferably formed the same size as the dummy cell (dummy cell transistor) 101, namely, a gate length (Lr) and a gate width (Wr) of the cell transistor 11 can be formed the same as a gate length (Ld) and a gate width (Wd) of the dummy cell transistor 101 (with reference to FIGS. 7A, 7B, 7C, and 7D). In this case, a trans-conductance Gmc of the cell transistor 11 and a trans-conductance Gmd of the dummy cell transistor 101 can be specified as the same value. Note, a threshold voltage $V_{FG}$ of the cell transistor 1 corresponds to a threshold voltage $V_G$ of the dummy cell transistor 101 detected from the sense circuit 5, and thus the following equation (1) is valid in a critical condition ($V_{FG} > V_{FGcrit}$: written state; $V_{FG} < V_{FGcrit}$: erased state).

$$V_{FGcrit} = \frac{V_{CCL} \cdot Cc + Q}{Ctot} = V_G = V_{DCL} = V_{CCL} \quad (1)$$

Note, a charge Q corresponds to a threshold voltage shift. Next, assuming a threshold voltage Vtci of the cell transistor 11, which is defined at the floating gate 112 of the cell transistor 11, to be equal to the threshold voltage of the dummy cell transistor 101, a sense current Is is determined by the following equation (2).

$$Is = \frac{\beta}{2}(V_G - Vt)^2 = \frac{\beta}{2}(V_{CCL} - Vtci)^2 \quad (2)$$

Note, in the equation (2), a relationship between the value of $\beta$ and trans-conductance Gmc (Gmd) is determined by the following equation (3) in saturation region of the transistor operation, which is generally known.

$$Gm = \frac{\partial I_D}{\partial V_G} = \frac{\partial(\beta/2(V_G - Vt)^2)}{\partial V_G} = \beta(V_G - Vt) \quad (3)$$

Therefore, the following equation (4) is obtained.

$$Gmc = \beta(V_{CCL} - Vtci) \quad (4)$$

When the cell transistor 11 (EEPROM cell 1) and the dummy cell transistor 101 are formed at the same specific size, or when a gate length (Ld) and a gate width (Wd) of the dummy cell transistor 101 are formed the same as a gate length (Lr) and a gate width (Wr) of the cell transistor 11, for example, Vtci is specified as 0.2 volts, $Vcc_L$ is specified as 1.2 volts, and a capacitance ratio is specified as 0.71 (Ctot=75.5 fF and Cc=53.4 fF; f: Femto, or $10^{-15}$), and the sense current Is is to be 10 µA, the written charge required to cause the critical condition is $26.3 \times 10^{-15}$ Q, as obtained from the above equations.

Note, the threshold voltage derived from written charge ($26.3 \times 10^{-15}$ Q) corresponds to a threshold change (for a write operation) $\Delta V_{FG} = Q/Ctot = 0.49$ volts. In the drawing of Window Closing shown in FIG. 5, a reference $V_X$ (−0.49 volts) indicates the threshold voltage of the sense circuit 5. Namely, as shown in FIG. 5, when the cell transistor 11 and the dummy cell transistor 101 are formed at the same size, the threshold voltage ($V_X = -0.49$ volts) is preferably positioned between the threshold voltage of a written cell and the threshold voltage of an erased cell (cell transistor 11). Consequently, even though the rewriting number is increased (over $10^4$ times) and the threshold difference between the written cell transistor and the erased cell transistor becomes small, erroneous operation is not easily caused.

Note, in the non-volatile semiconductor memory device according to the present embodiment, the EEPROM cell transistor 11 and the dummy cell transistor 101 (dummy cell) are formed the same wafer processes performed to produce the non-volatile semiconductor memory device, so that threshold voltages of the EEPROM cell transistor 11 and the dummy cell transistor 101 change the same when these threshold voltages fluctuate with wafer processing conditions that deviate from the standard. In the above embodiment, the cell transistor 11 and the dummy cell transistor 101 are formed at the same size, but in the present invention, the sizes of the cell transistor 11 and the dummy cell transistor 101 can be different. Namely, the gate length (Ld) and the gate width (Wd) of the dummy cell transistor 101 can be of different sizes from the gate length (Lr) and the gate width (Wr) of the cell transistor 11, in accordance with characteristics of the cell transistor 11 and the dummy cell transistor 101, especially, the gate length (Ld) the dummy cell transistor 101 can be determined in accordance with characteristics of the cell transistor 11.

Next, read and write operations in the above described embodiment of the non-volatile semiconductor memory device will be explained.

Figure 8:
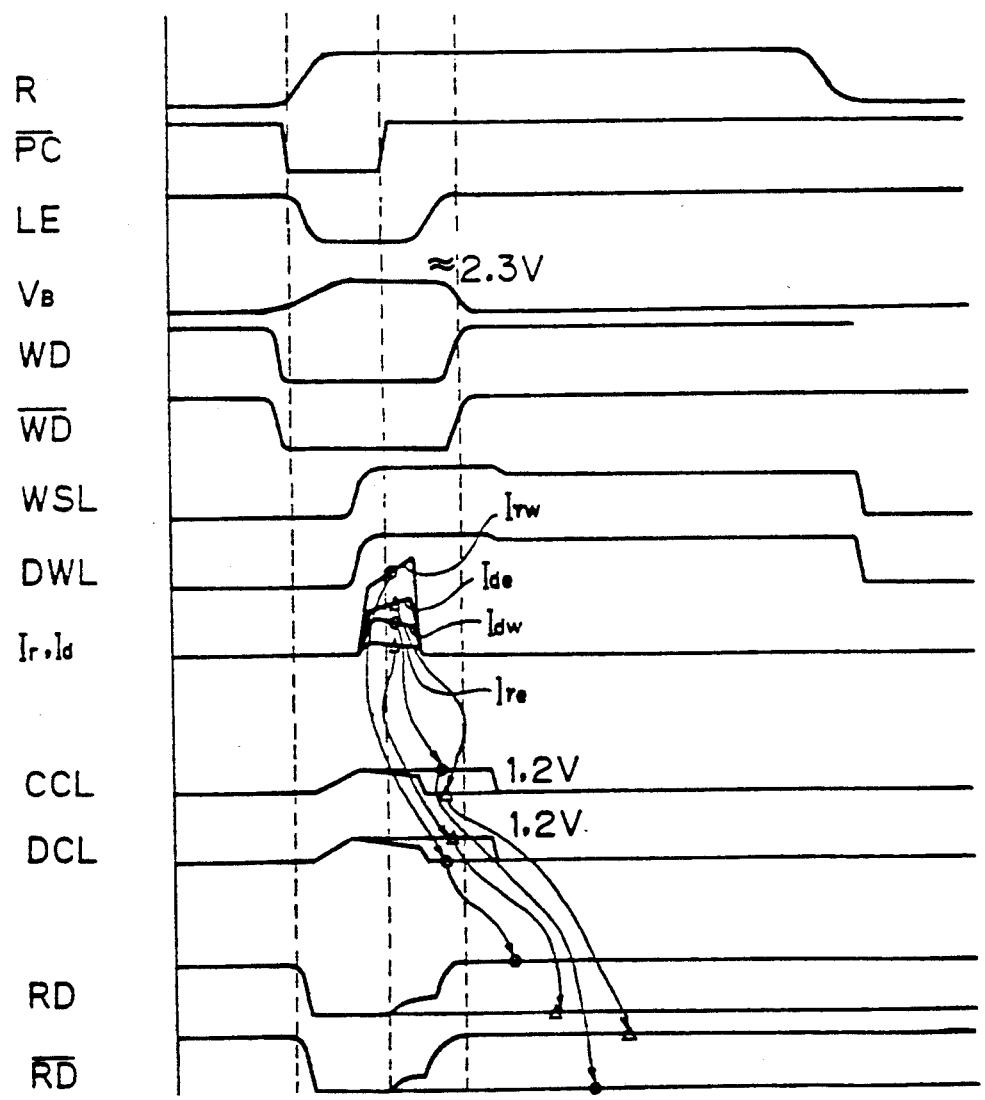
FIG. 8 is a waveform diagram for explaining a read out operation in the non-volatile semiconductor memory device shown in FIG. 4.

FIG. 8 is a waveform diagram for explaining a read out operation in the non-volatile semiconductor memory device shown in FIG. 4.

First, a read-out operation will be explained. As shown in FIG. 8, when a read-out control signal R is changed to a high level, both write data WD and $\overline{WD}$ are changed to a low level, and then a precharge control signal $\overline{PC}$ is changed to an active state (low level), so that the nodes $N_1$ and $N_2$ are precharged at a potential of the power supply voltage Vcc. Next, a bias voltage $V_E$ is increased and it goes toward 1~4 volts (for example, about 2.3 volts), and then, a word select line WSL and a dummy word select line DWL are selected (high levels). When the precharge control signal $\overline{PC}$ is changed to an inactive state (high level), a specific potential is caused between the control column line CCL and the drain column line DCL, or between the nodes $N_1$ and $N_2$.

Furthermore, when a latch enable signal LE is changed to an active state (high level), a sense operation (latch operation) in the sense circuit 5 is settled and outputs of the sense circuit 5 are validated. Note, the outputs of the sense circuit 5 are brought out from read-out data lines RD and $\overline{\text{RD}}$ through inverters 151 and 152, with reference to FIGS. 8 and 4.

Note, in the present embodiment, an erased state is defined when electrodes are injected into the floating gate of the EEPROM cell, and a written state is defined when the electrodes are discharged from the floating gates of the specific EEPROM cells corresponding to the required bits.

Namely, with reference to FIGS. 4 and 8, when the cell transistor 11 is a written state, or when electrodes are discharged from the floating gates of the cell transistor 11, a current Irw flowing through the cell transistor 11 from the drain column line DCL is increased, so that a potential of the node $N_1$ (drain column line DCL) is decreased to a low level. At the same time, the gate of the dummy cell transistor 101 is at the low level and a current Idw flowing through the dummy cell transistor 101 from the control column line CCL is decreased, and thus a potential of the node $N_2$ is increased to a high level which is limited to a voltage at the control column line CCL of 1.2 volts at the maximum voltage by the transistors 161, 162 and the bias voltage $V_B$, with reference to FIGS. 4 and 8. Consequently, the read-out data line RD is at a high level, and the read-out data line $\overline{\text{RD}}$ is at a low level.

Conversely, when the cell transistor 11 is an erased state, or when electrodes are injected into the floating gate of the cell transistor 11, a current Ire flowing through the cell transistor 11 from the drain column line DCL is decreased (with reference to FIGS. 4 and 8), so that a potential of the node $N_1$ is increased to a high level (for example, a voltage of the drain column line DCL is limited to 1.2 volts at the maximum) voltage by the transistors 161, 162 and the bias voltage $V_B$. At the same time, the gate of the dummy cell 101 is at the high level and a current Ide flowing through the dummy cell 101 from the control column line CCL is increased (with reference to FIG. 8), and thus a potential of the node $N_2$ (control column line CCL) is decreased to a low level. Consequently, the read-out data line $\overline{\text{RD}}$ is at a low level, and the read-out data line RD is at a high level.

Note, as described above, when a current Ir (Irw) flowing through the cell transistor 11 (EEPROM cell 1) from the drain column line DCL is larger than a current Id (Idw) flowing through the dummy cell (transistor) 101 from the control column line CCL (which is the written state) at a read-out operation, the current Id (Idw) is decreased, so that the difference between a potential of the drain column line DCL and a potential of the control column line CCL becomes large. Note, the potential of the drain column line DCL is lower than that of the control column line CCL. Conversely, when a current Ir (Ire) flowing through the cell transistor 11 (EEPROM cell 1) from the drain column line DCL is smaller than a current Id (Ide) flowing through the dummy cell (transistor) 101 from the control column line CCL (which is the erased state) at the read-out operation, the current Id (Ide) is increased, so that the difference between a potential of the drain column line DCL and a potential of the control column line CCL becomes large. Note, the potential of the drain column line DCL is higher than that of the control column line CCL. Therefore, an erroneous operation is not easily caused, at the read-out operation.

Further, a reset operation at the time of reading out will be briefly explained. First, the read-out control signal R is specified as a low level, the bias voltage $V_B$ is specified as a low level, both write data lines WD and $\overline{\text{WD}}$ are specified as a high level, both the drain column line DCL and the control column line CCL are specified as a low level, and then the word select line WSL and the dummy word select line DWL are specified as a low level, so that the read-out operation is completed.

Next, definitions of write/erase will be described, and then, a write/erase operation in the non-volatile semiconductor memory device shown in FIG. 4 will be explained. When an erase operation is carried out, in the EEPROM cell 1 shown in FIG. 4, a control electrode 12a of a control gate 12 is changed to a high level (high voltage), and both drain 111 and source 113 of a cell transistor 11 are held at a low level, so that a Fowler-Nordheim current flows through a tunnel oxide film 11a of the cell transistor 11 and electrons are injected into a floating gate (a gate 112). Consequently, a threshold voltage $V_{TH}$ of the cell transistor 11 against the control electrode 12a is increased, and this state is defined as an erased state.

FIG. 9 is a waveform diagram for explaining a write/erase operation in the non-volatile semiconductor memory device shown in FIG. 4.

First, a write/erase operation will be explained. As shown in FIG. 9, the levels of write data lines WD and $\overline{\text{WD}}$ are settled (note, addresses are also settled) by write data, and further, a bias voltage $V_B$ is increased, for example, the bias voltage $V_B$ is brought to the power supply voltage Vcc. Next, a latch enable signal LE is specified to an active state (high level). Furthermore, a voltage of one of a drain column line DCL and a control column line CCL, whose level is previously specified as a high level, is further increased to from about a few volts to 30 volts, by increasing a write/erase power supply voltage Vpp and by a function of pump circuits (high voltage switching circuits) 71, 72, so that the above described write operation (or, erase operation) is carried out.

Next, a rest operation will be explained. As shown in FIG. 9, the write data lines WD and $\overline{\text{WD}}$ are fixed at high levels, a word select line WSL is specified as a low level, and the bias voltage $V_B$ is specified as a low level, so that one of the drain column line DCL and the control column line CCL which was the high level is changed to a low level. Furthermore, the latch enable signal LE and the write/erase power supply voltage Vpp are specified as low levels, so that the write/erase operation is completed.

Figure 10A:
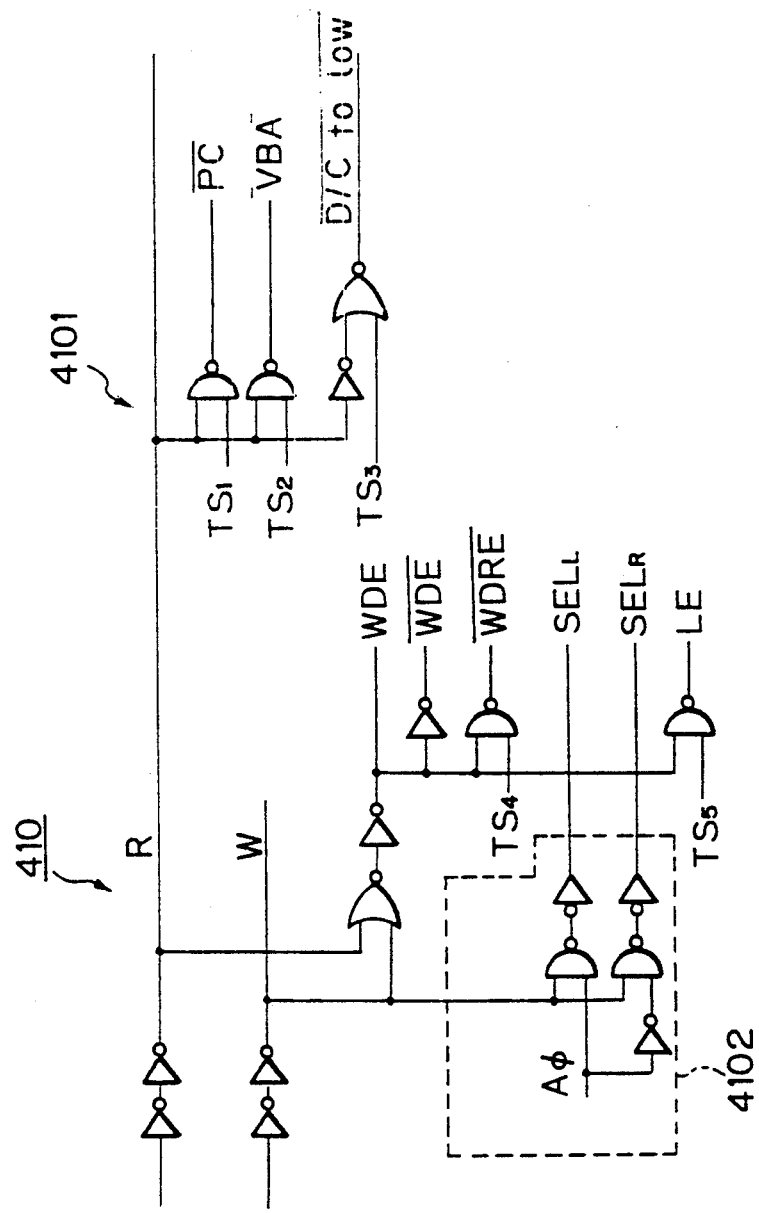
FIGS. 10A and 10B are circuit diagrams indicating an example of a signal generating circuit in the non-volatile semiconductor memory device shown in FIG. 3.
Figure 10B:
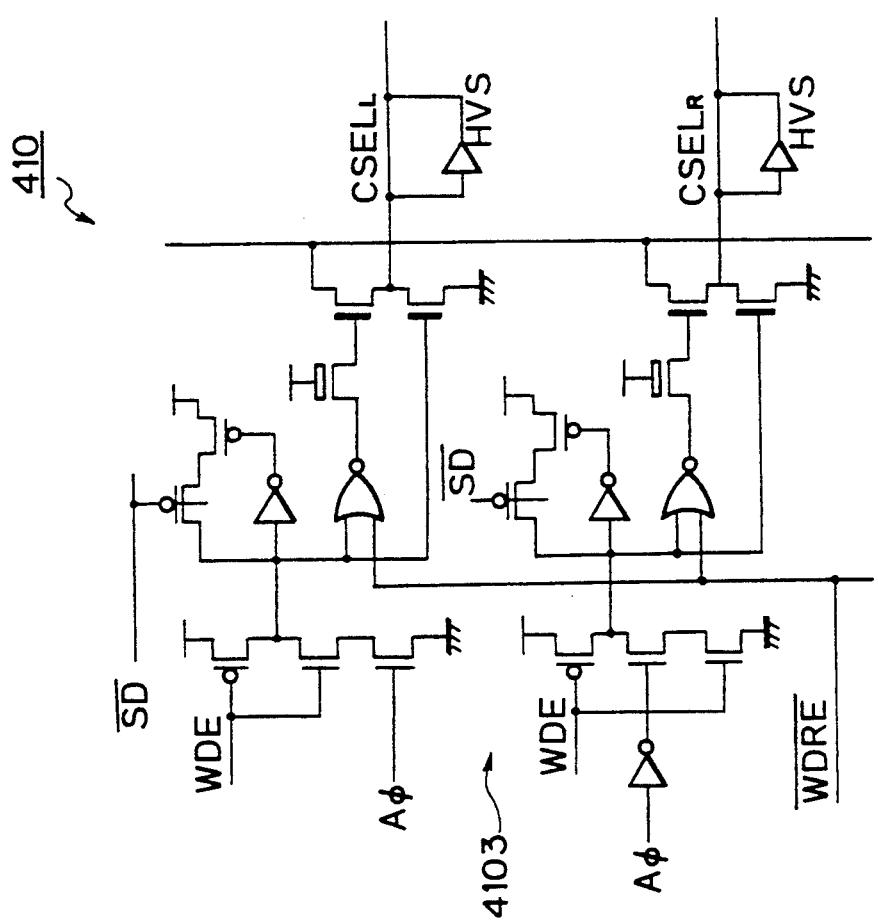

FIGS. 10A and 10B are circuit diagrams indicating an example of a signal generating circuit in the non-volatile semiconductor memory device shown in FIG. 3, more particularly, an example of the signal generation circuit 410 shown in FIG. 3.

As shown in FIGS. 3, 10A and 10B, the signal generation circuit 410 comprises circuit portions 4101, 4102, and 4103, and a plurality of signals output from the signal generation circuit 410 are applied to the memory portion 406 through the write data signal generation circuit 600. Note, in FIG. 10A, references $TS_1$ to $TS_5$ denote timing signals output from a timing signal generator (not shown). Further, the control signals $SEL_L$ and $SEL_R$, which are output signals of the circuit portion 4102, are used in the embodiment of the non-volatile semiconductor memory device shown in FIG. 12, and the control signals $CSEL_L$ and $CSEL_R$, which are output signals of the circuit portion 4103, are used in the embodiment of the non-volatile semiconductor memory devices shown in FIGS. 12 and 13. Note, these circuit portions 4101, 4102, and 4103 indicate an exampel, and a plurality of circuit configurations can be provided.

Figure 11:
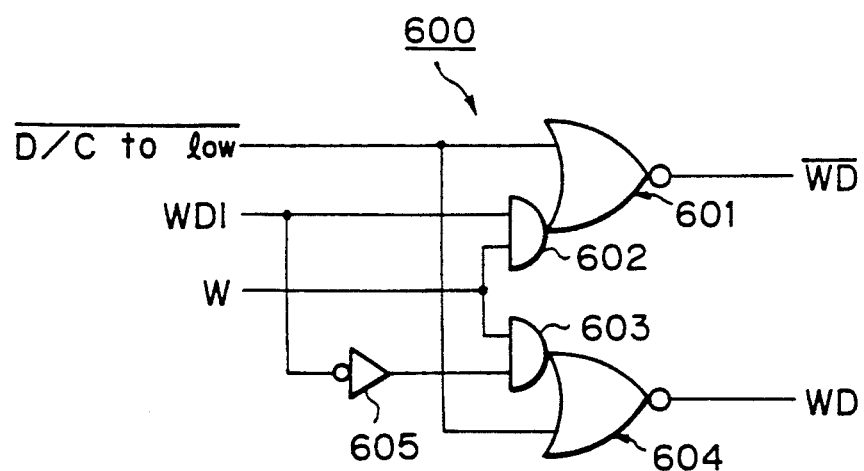
FIG. 11 is a logic circuit diagram indicating an example of a circuit for producing write data signals in the non-volatile semiconductor memory device shown in FIG. 3.

FIG. 11 is a logic diagram indicating an embodiment of a circuit for producing write data signals in the non-volatile semiconductor memory device shown in FIG. 3, and more particularly, an embodiment of the write data signal generation circuit 600 shown in FIG. 3.

As shown in FIG. 11, the write data signal generation circuit 600 is used to generate signals (write data signal WD and $\overline{WD}$) to be applied to write data lines WD and $\overline{WD}$. The write data signal generation circuit 600 comprises AND-NOR complexed gates 601(602), 604(603), and an inverter 605, and the write data signal generation circuit 600 generates the write data signal WD and $\overline{WD}$ from a write signal W, an input signal WDI and timing signal $\overline{D/C \text{ to low}}$. Note, the signal $\overline{D/C \text{ to low}}$ is specified to force the write data signal WD and $\overline{WD}$ inactive state (high level) at the end of write/erase operation.

Further, though access time is limited the long seting time of the bias voltage $V_B$ in the prior art non-volatile semiconductor memory devices, according to the embodiment of the non-volatile semiconductor memory device shown in FIG. 4, an effective capacitance load at the bias voltage $V_B$ can be reduced in accordance with source to gate feedback of transistors 161, 162, whereas access time can be shortened. Furthermore, in the non-volatile semiconductor memory device according to the present embodiment, write/erase for each individual bit can be carried out in one operation, so that deterioration of the cell transistor can be decreased.

Figure 12:
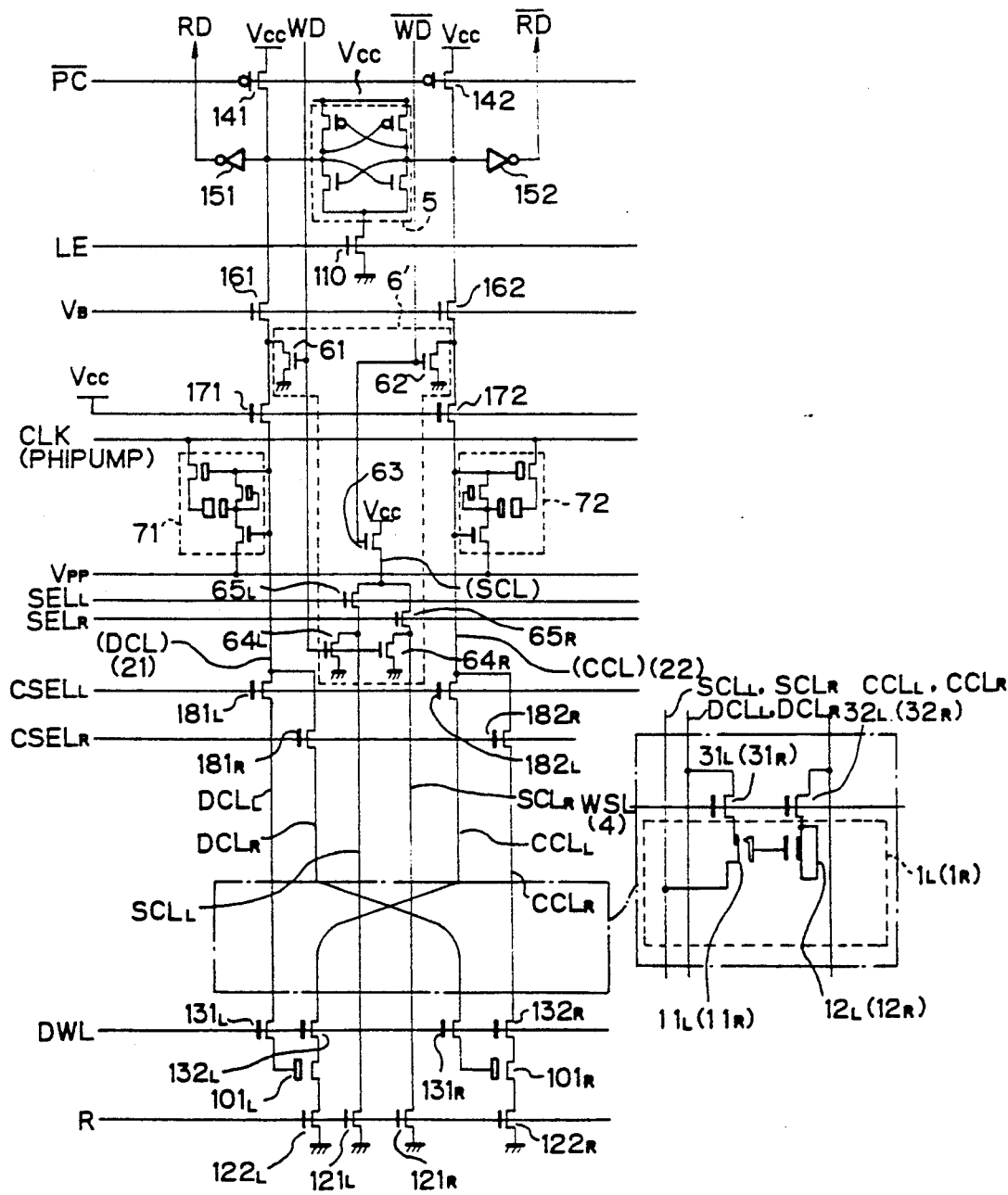
FIG. 12 is a circuit diagram indicating another embodiment of a non-volatile semiconductor memory device according to the present invention.

FIG. 12 is a circuit diagram indicating another embodiment of a non-volatile semiconductor memory device according to the present invention. Comparing the non-volatile semiconductor memory devices shown in FIGS. 4 and 11, in the non-volatile semiconductor memory device of FIG. 12, a drain column line DCL, a control column line CCL, and a source column line SCL are divided into two groups which can be selected by select signals $SEL_L$, $SEL_R$. Note, each of the two groups includes an EEPROM cell $1_L$, or $1_R$. Note, in the non-volatile semiconductor memory device shown in FIG. 12, the same configurations in the non-volatile semiconductor memory device shown in FIG. 4 are indicated by the same references described in FIG. 4.

Namely, as shown in FIG. 12, in the non-volatile semiconductor memory device according to the present embodiment, a write stabilizing circuit 6' comprises transistors controlled by the select signals $SEL_L$, $SEL_R$, and transistors $64_L$, $64_R$ whose gate terminals are connected to a write data WD corresponding to the transistor 64 in the write stabilizing circuit 6 shown in FIG. 4. Consequently, two source column lines $SCL_L$, $SCL_R$, which can be selected by the select signals $SEL_L$, $SEL_R$, are provided.

Furthermore, in the non-volatile semiconductor memory device shown in FIG. 12, with regard to the drain column line DCL and the control column line CCL of the non-volatile semiconductor memory device shown in FIG. 4, two drain column lines $DCL_L$, $DCL_R$ and two control column lines $CCL_L$, $CCL_R$, which can be selected by the select signals $SEL_L$, $SEL_R$ through transistors $181_L$, $182_L$ and $181_R$, $182_R$, are provided.

Note, each of the two drain column lines $DCL_L$, $DCL_R$, two control column lines $CCL_L$, $CCL_R$, and two source column lines $SCL_L$, $SCL_R$ are connected to each of two EEPROM cells $1_L$ and $1_R$, respectively. Furthermore, as clearly described in FIG. 12, with regard to the dummy cell, two dummy cells corresponding to the two set of column lines are provided in the non-volatile semiconductor memory device of the present embodiment.

Note, each of the EEPROM cells $1_L$ and $1_R$ is the same configuration as the cell explained with reference to FIG. 4. Further, enhancement type transistors 171, 172 are used to protect a sense circuit 5 from high voltages (for example, over 18 volts) applied to the drain column line DCL and the control column line CCL.

As described above, according to the non-volatile semiconductor memory device of the present embodiment, twice as many of EEPROM cells as in the non-volatile semiconductor memory device shown in FIG. 4 can be driven by the same number of sense circuits 5, the write stabilizing circuits 6', the pump circuits 71, 72, and a pair of control lines 21, 22 (drain column line DCL and control column line CCL) as in that shown in FIG. 4.

Note, in the non-volatile semiconductor memory device shown in FIG. 12, the two EEPROM cells $1_L$ and $1_R$ are provided for each word select line WSL and the same sense circuit 5, the same write stabilizing circuit 6', the same pump circuit 71, 72, and the same pair of control lines 21, 22 are also provided, however a plurality of EEPROM cells (n pieces) can be provided for the same sense circuit 5, the same pair of control lines 21, 22, and the like.

Figure 13:
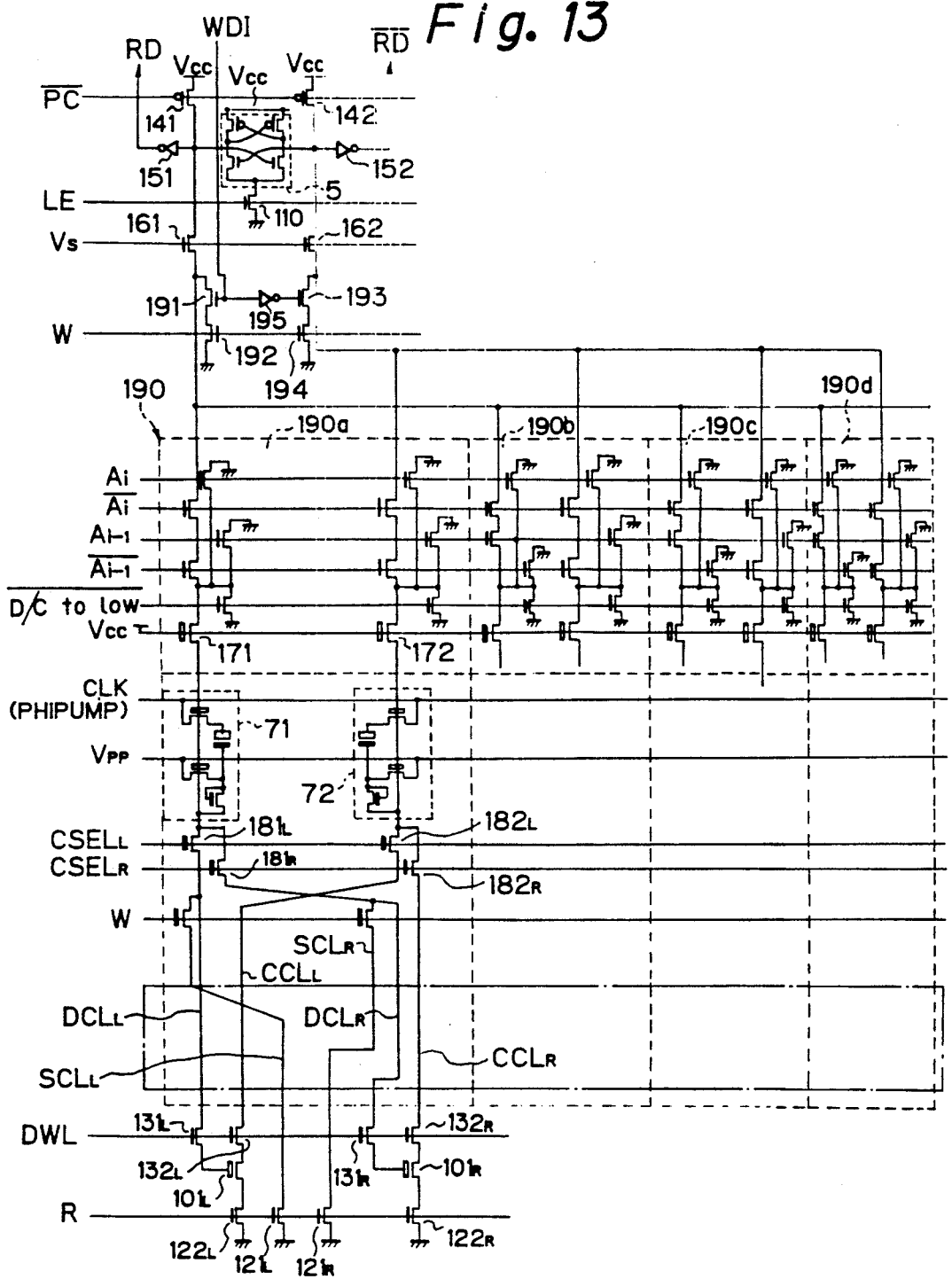
FIG. 13 is a circuit diagram indicating still another embodiment of a non-volatile semiconductor memory device according to the present invention.

FIG. 13 is a circuit diagram indicating still another embodiment of a non-volatile semiconductor memory device according to the present invention. As shown in FIG. 13, the non-volatile semiconductor memory devices shown in FIG. 13, comprises a decoder portion 190. The decoder portion comprises four blocks $190a$ to $190d$, and one block of the four blocks is selected in accordance with signals Ai, $\overline{Ai}$, $Ai_{-1}$, $\overline{Ai_{-1}}$. Note, in the non-volatile semiconductor memory devices shown in FIG. 13, a write stabilizing circuit 6 or 6' provided in that shown in FIGS. 4 or 11 can be deleted. Further, one sense circuit 5 is connected to four blocks, and each block (for example, block $190a$) includes two group of column lines, so that eight dummy cells (or eight group of column lines) can be connected in accordance with select signals Ai, $\overline{Ai}$, $Ai_{-1}$, $\overline{Ai_{-1}}$, and $CSEL_L$, $CSEL_R$. Note, a plurality of EEPROM cells each including a cell transistor 11 and a control gate 12 are provided in the non-volatile semiconductor memory device, however they are not shown in FIG. 13.

In the non-volatile semiconductor memory devices shown in FIG. 13, transistors 191 to 194 and an inverter 195 are provided, and a signal WDI is applied to a gate of the transistor 191 and an inverted signal of the signal WDI is applied to a gate of the transistor 193 through the inverter 195. Note, gates of the transistors 192 and 193 are applied with a write signal W.

In the above three embodiments of the non-volatile semiconductor memory device according to the present invention, various types of EEPROM cells can be used. However, an EEPROM cell, which includes a control gate made of signal polycrystal line silicon sufficient area, making it possible to write at a comparatively low voltage, and having a high degree of write repeatability, is preferable, because a drain column line DCL (or $DCL_L$, $DCL_R$), a control column line CCL ($CCL_L$, $CCL_R$), and a source column line SCL ($SCL_L$, $SCL_R$) are required for the non-volatile semiconductor memory device of the present invention. Namely, in the above non-volatile semiconductor memory device comprising the EEPROM cell including the signal polycrystal line silicon layer of the large occupied area, and the like, the drain column line DCL, the control column line CCL, and the source column line SCL can be wired above the area occupied by the EEPROM cells, so that the occupied area of the EEPROM cells can be effectively usable.

Figure 14A:
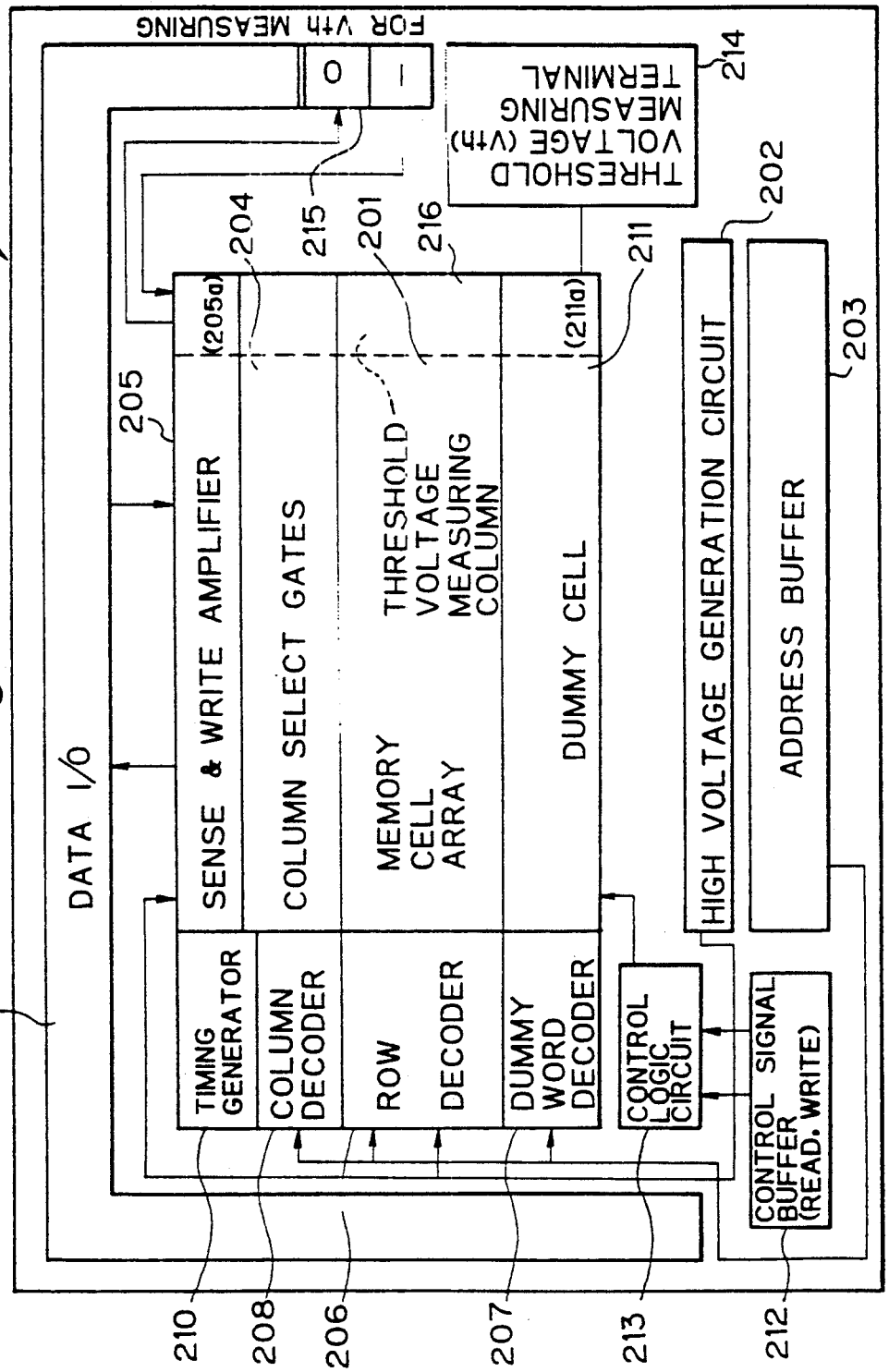
FIG. 14A is a block diagram indicating an example of a non-volatile semiconductor memory device according to the present invention.

FIG. 14A is a block diagram indicating an example of a non-volatile semiconductor memory device according to the present invention. As shown in FIG. 14A, a non-volatile semiconductor memory device (EEPROM chip) of the present invention is formed in a single semiconductor body 200 and the non-volatile semiconductor memory device 200 comprises: a memory cell array 201, a sense and write amplifier 205, and a dummy cell 211, which all correspond to the non-volatile semiconductor memory device shown in FIG. 4. Further, the non-volatile semiconductor memory device 200 comprises a high voltage generation circuit 202, an address buffer 203, a column select gates 204, a row decoder 206, a dummy word decoder 207, a column decoder 208, a data I/O portion 209, a timing generator 210, a control signal buffer 212, and a control logic circuit 213. Note, the high voltage generation circuit 202 corresponds to the booster circuit 402, the constant-voltage circuit 403, and the waveform shaping circuit 404 in the high voltage generation portion 400 shown in FIG. 3.

As shown in FIG. 14A, in the non-volatile semiconductor memory device, the high voltage generation circuit 202 is connected to the sense and write amplifier 205 (sense circuit) to apply a high voltage to the EEPROM cell array 201 (EEPROM cell 1). The address buffer 203 is connected to the column decoder 208, the row decoder 206, and the dummy word decoder 207. The data I/O portion 209 is connected to the sense and write amplifier 205 to input and output data. The control signal buffer 212 receives control signals. The control logic circuit 213 is connected to the control signal buffer 212 to control the state (read state, write/erase state) of the non-volatile semiconductor memory device 200.

Note, as shown in FIG. 14A, the non-volatile semiconductor memory device further comprises a threshold voltage measuring column 216, a threshold voltage measuring terminal 214, and data input/output portion 215.

Figure 14B:
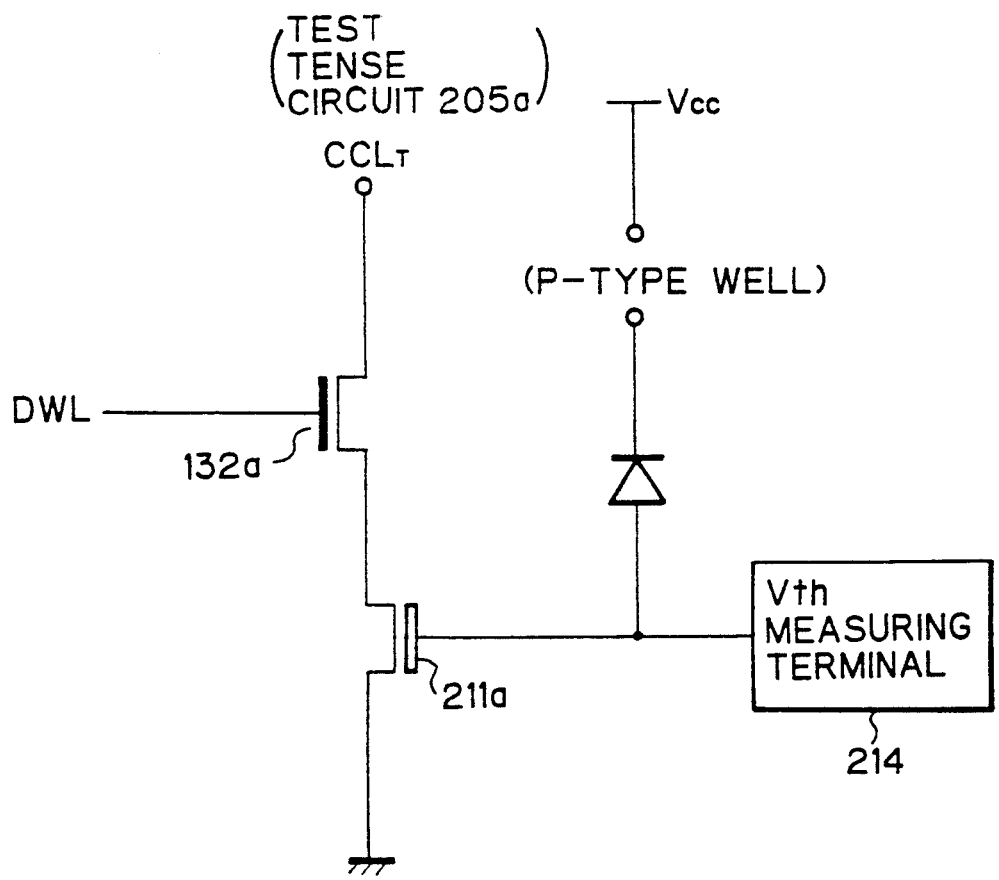
FIG. 14B is a circuit diagram indicating a dummy cell portion in a threshold measuring portion of the non-volatile semiconductor memory device shown in FIG. 14A.

FIG. 14B is a circuit diagram indicating a threshold measuring portion of the non-volatile semiconductor memory device shown in FIG. 14A. As shown in FIG. 14B, the threshold voltage measuring column 216 includes a test dummy cell transistor (dummy cell) 211a and a test sense circuit (205a) to estimate a threshold voltage of a cell transistor (11) in the EEPROM cell arry 201 by applying a gate voltage of the test dummy cell transistor 211a. The threshold voltage measuring terminal 214 is connected to the threshold voltage measuring column 216 (or a gate of the test dummy cell 211a) to apply various voltages. Note, a drain of the test dummy cell 211a is connected to a test control column line (CCL$_T$) through a transfer gate 132a. The threshold voltage measuring I/O portion 215 is connected to the test sense circuit 205a for inputting or detecting data to the threshold voltage of the cell transistor 11 (with reference to FIG. 14A), when applying various voltages to the threshold voltage measuring terminal 214.

Figure 15:
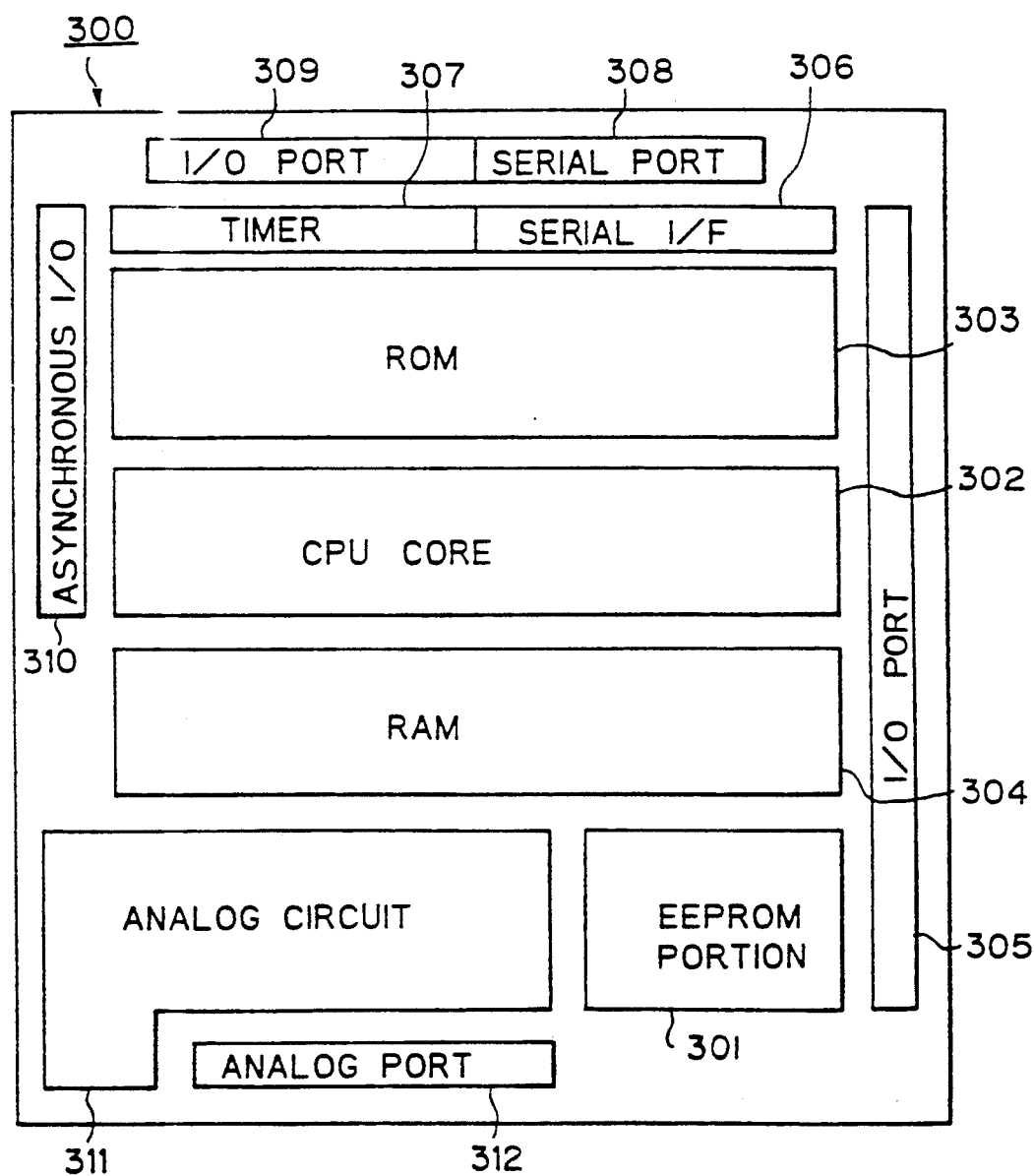
FIG. 15 is a block diagram indicating an example of a micro-controller including a non-volatile semiconductor memory device according to the present invention.

FIG. 15 is a block diagram indicating an example of a micro-controller including a non-volatile semiconductor memory device according to the present invention. The non-volatile semiconductor memory device (EEPROM) of the present invention can be provided in the micro-controller, which is used for on-vehicle equipment (e.g., for setting control parameters or codes suitable for an application environment), a measuring apparatus, a camera, a telephone set (e.g., for storing telephone numbers), a telemetering system, a fuzzy control apparatus, and the like.

Namely, as shown in FIG. 15, the micro-controller 300, which is formed in a single semiconductor body, comprise a central processing unit core (CPU core) 301, an input/output port (I/O port) 305, 309, and EEPROM portion 301 corresponding to the non-volatile semiconductor memory device of the present invention. Furthermore, the micro-controller 300 comprises a read only memory (ROM) 303, a random access memory (RAM) 304, a serial interface (serial I/F) 306, a timer 307, a serial port 308, an asynchronous I/O port 310, an analog circuit 311, and an analog port 312. Note, the EEPROM portion 301, the ROM 303, and the RAM 304 are connected to the CPU core 302 and are controlled thereby, and the I/O ports 305, 308, 309, 310, the I/F 306, and the timer 307 are connected to the CPU core 302 and input, output, or transfer data or signals for the CPU core 302. Further, the analog circuit 311 and the analog port 312 are used to directly input and output analog signals between the micro-controller 300 and an external device.

In accordance with a non-volatile semiconductor memory device according to the present invention as described above, an EEPROM cell, a dummy cell and a sense circuit are operatively connected to a drain column line and a control column line, and the sense circuit reads out the content written in the EEPROM cell by the difference between a current flowing through the EEPROM cell from the drain column line and a current flowing through the dummy cell from the control column line, so that a data write or erase operation may be performed for any individual bit in one operation. Therefore, in the non-volatile semiconductor memory device of the present invention, each required single bit can be written/erased in one operation, the same as in a general DRAM, and deterioration of a cell transistor can be decreased. Furthermore, in the non-volatile semiconductor memory device according to the present invention, an EEPROM cell transistor and a dummy cell transistor are formed in the same wafer processes of producing the non-volatile semiconductor memory device, so that threshold voltages Vth of the EEPROM cell transistor and the dummy cell transistor fluctuate similarly with process variations.

Many widely differing embodiments of the present invention may be constructed without departing from the spirit and scope of the present invention, and it should be understood that the present invention is not limited to the specific embodiments described in this specification, except as defined in the appended claims.

We claim:

1. A non-volatile semiconductor memory device comprising:
   first and second signal lines;
   a memory cell, operatively connected to said first and second signal lines, for storing data;
   a dummy cell, operatively connected to said first and second signal lines; and a sense circuit, for amplifying the difference between a potential of said first signal line and a potential of said second signal line;

wherein, when a first current flowing through said memory cell from said first signal line, in response to data stored in said memory cell, is larger than a second current flowing through said dummy cell from said second signal line at a read-out operation, said second current is decreased; and when said first current is smaller than said second current at the read-out operation, said second current is increased.

2. A non-volatile semiconductor memory device as claimed in claim 1, wherein said non-volatile semiconductor memory device further comprises:
   first and second transfer gates, provided between said memory cell and said first and second signal lines;
   a word select line, applied with a word select signal for controlling said first and second transfer gates;
   third and fourth transfer gates, provided between said dummy cell and said first and second signal lines; and
   a dummy word select line, applied with a dummy word select signal for controlling said third and fourth transfer gates.

3. A non-volatile semiconductor memory device as claimed in claim 2, wherein a gate of said dummy cell is connected to said first signal line through said third transfer gate, a drain thereof is connected to said second signal line through said fourth transfer gate, and a source thereof is connected to the ground through a fifth transfer gate controlled by a read control signal.

4. A non-volatile semiconductor memory device as claimed in claim 1, wherein said non-volatile semiconductor memory device further comprises a write stabilizing circuit, connected to said first and second signal lines, for improving reliability at a write operation, and an output line of said write stabilizing circuit is connected to said memory cell.

5. A non-volatile semiconductor memory device as claimed in claim 4, wherein said output line of said write stabilizing circuit is connected to the ground through a sixth transfer gate controlled by a read control signal.

6. A non-volatile semiconductor memory device as claimed in claim 1, wherein said non-volatile semiconductor memory device further comprises a first high-voltage switching circuit connected to said first signal line and a second high-voltage switching circuit connected to said second signal line, for boosting and applying a write/erase power supply voltage between said first and second signal lines by using a pumping clock signal.

7. A non-volatile semiconductor memory device as claimed in claim 1, wherein said memory cell comprises:
   a cell transistor, including a floating gate, a drain connected to said first signal line through said first transfer gate, and a source connected to an output line of a write stabilizing circuit, for storing data by injecting electrons into said floating gate; and
   a control gate, including a control electrode connected to said second signal line through said second transfer gate, and a floating electrode connected to said floating gate of said cell transistor.

8. A non-volatile semiconductor memory device as claimed in claim 7, wherein said cell transistor and said dummy cell are formed at the same size.

9. A non-volatile semiconductor memory device as claimed in claim 8, wherein a gate length and a gate width of said dummy cell are formed the same as a gate length and a gate width of said cell transistor.

10. A non-volatile semiconductor memory device as claimed in claim 7, wherein a gate length of said dummy cell is determined in accordance with the characteristics of said cell transistor.

11. A non-volatile semiconductor memory device as claimed in claim 7, wherein said cell transistor and said dummy cell are formed in the same processes of producing said non-volatile semiconductor memory device.

12. A non-volatile semiconductor memory device as claimed in claim 7, wherein said memory cell includes a single polycrystal line silicon layer of a large occupied area, and said first and second signal lines are wired above the area occupied by said memory cell.

13. A non-volatile semiconductor memory device as claimed in claim 1, wherein said memory cell is an EEPROM cell.

14. A non-volatile semiconductor memory device as claimed in claim 1, wherein said sense circuit is a differential type sense amplifier.

15. A non-volatile semiconductor memory device as claimed in claim 1, wherein said sense circuit is connected to said first and second signal lines through seventh and eighth transfer gates with a bias voltage applied thereto.

16. A non-volatile semiconductor memory device as claimed in claim 1, wherein said sense circuit is used to write specific data into said said memory cell.

17. A non-volatile semiconductor memory device as claimed in claim 1, wherein said first and second signal lines and an output line of a write stabilizing circuit are plurally provided, said memory cell is plurally provided in parallel to each group of said first and second signal lines and said output lines of said write stabilizing circuit through a select circuit, and one of said plurality of memory cells is selected in response to select signals applied to said select circuit.

18. A non-volatile semiconductor memory device as claimed in claim 1, wherein said non-volatile semiconductor memory device further comprises: a high voltage generation portion for applying a high voltage to said memory cell; an address latch circuit for latching input and output addresses; and a data latch circuit for latching input and output data.

19. A non-volatile semiconductor memory device as claimed in claim 1, wherein said non-volatile semiconductor memory device is formed in a single semiconductor body and said non-volatile semiconductor memory device further comprises: a high voltage generation circuit, connected to said sense circuit, for applying a high voltage to said memory cell; an address buffer, connected to a column decoder, a row decoder, and a dummy word decoder, for inputting and outputting addresses; a data input/output portion connected to said sense circuit, for inputting and outputting data; and a control signal buffer for receiving control signals; and a control logic circuit, connected to said control signal buffer, for controlling the state of said non-volatile semiconductor memory device.

20. A non-volatile semiconductor memory device as claimed in claim 19, wherein said non-volatile semiconductor memory device further comprises: a threshold voltage measuring column including a test dummy cell and a test sense circuit, for estimating a threshold voltage of said memory cell by measuring said test dummy cell, a threshold voltage measuring terminal, connected to said threshold voltage measuring column, for applying various voltages, and a threshold voltage measuring input/output portion, connected to said test sense circuit, for inputting or detecting data to measure the threshold voltage of said memory cell when applying various voltages to said threshold voltage measuring terminal.

* * * * *

UNITED STATES PATENT AND TRADEMARK OFFICE
CERTIFICATE OF CORRECTION

PATENT NO.   : 5,303,197
DATED        : April 12, 1994
INVENTOR(S)  : Miyashita et al.

It is certified that error appears in the above-indentified patent and that said Letters Patent is hereby corrected as shown below:

Column 6, line 3, delete "int" and insert --inherent in--.

Column 10, line 26, after "formed", insert --by--.

Column 11, line 7, delete "electrodes" and insert --electrons--.

Column 11, line 9, delete "electrodes" and insert --electrons--.

Column 11, line 13, delete "electrodes" and insert --electrons--.

Column 11, line 30, delete "electrodes" and insert --electrons--.

Column 12, line 42, delete "rest" and insert --reset--.

Column 13, line 4, delete "exampel" and insert --example--.

Column 13, line 22, delete "seting" and insert --setting--.

Column 18, line 31, after "into", delete "said".

Signed and Sealed this

Tenth Day of January, 1995

*Attest:*

BRUCE LEHMAN

*Attesting Officer*  *Commissioner of Patents and Trademarks*